(12) United States Patent
Zhu

(10) Patent No.: US 11,652,103 B2
(45) Date of Patent: May 16, 2023

(54) SEMICONDUCTOR DEVICE, MANUFACTURING METHOD THEREOF, AND ELECTRONIC DEVICE INCLUDING THE DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 219 days.

(21) Appl. No.: 17/261,862

(22) PCT Filed: Oct. 31, 2018

(86) PCT No.: PCT/CN2018/113049
§ 371 (c)(1),
(2) Date: Jan. 20, 2021

(87) PCT Pub. No.: WO2020/082405
PCT Pub. Date: Apr. 30, 2020

(65) Prior Publication Data
US 2021/0296316 A1 Sep. 23, 2021

(30) Foreign Application Priority Data
Oct. 26, 2018 (CN) .......................... 201811265733.2

(51) Int. Cl.
*H01L 27/092* (2006.01)
*H01L 29/04* (2006.01)
(Continued)

(52) U.S. Cl.
CPC ...... *H01L 27/0922* (2013.01); *H01L 21/0259* (2013.01); *H01L 21/02609* (2013.01);
(Continued)

(58) Field of Classification Search
CPC ............. H01L 27/0922; H01L 21/0259; H01L 21/02609; H01L 21/28518;
(Continued)

(56) References Cited

U.S. PATENT DOCUMENTS

2010/0207172 A1* 8/2010 Masuoka .......... H01L 29/78642
438/212
2018/0277442 A1* 9/2018 Leobandung ..... H01L 29/66666

FOREIGN PATENT DOCUMENTS

CN 101379609 3/2009
CN 106252352 12/2016
(Continued)

OTHER PUBLICATIONS

First Chinese Office Action, issued in the corresponding Chinese patent application No. 201811265733.2, dated Nov. 14, 2019, 19 pages.
(Continued)

*Primary Examiner* — Tong-Ho Kim
(74) *Attorney, Agent, or Firm* — Hamre, Schumann, Mueller & Larson, P.C.

(57) ABSTRACT

The present disclosure provides a semiconductor device, a manufacturing method thereof, and an electronic device including the semiconductor device. According to an embodiment of the present disclosure, the semiconductor device may comprise: a substrate; a first device and a second device that are sequentially stacked on the substrate. Each of the first device and the second device comprises: a first source/drain layer, a channel layer, and a second source layer that are sequentially stacked from bottom to top, and a gate
(Continued)

stack around at least a part of an outer periphery of the channel layer, wherein sidewalls of the respective channel layers of the first device and the second device extend at least partially along different crystal planes or crystal plane families.

39 Claims, 23 Drawing Sheets

(51) Int. Cl.

| | |
|---|---|
| *H01L 29/06* | (2006.01) |
| *H01L 29/417* | (2006.01) |
| *H01L 29/423* | (2006.01) |
| *H01L 29/786* | (2006.01) |
| *H01L 21/02* | (2006.01) |
| *H01L 21/285* | (2006.01) |
| *H01L 21/8238* | (2006.01) |
| *H01L 29/66* | (2006.01) |
| *H01L 29/45* | (2006.01) |

(52) U.S. Cl.
CPC .......... *H01L 21/28518* (2013.01); *H01L 21/823807* (2013.01); *H01L 21/823814* (2013.01); *H01L 21/823871* (2013.01); *H01L 21/823885* (2013.01); *H01L 29/045* (2013.01); *H01L 29/0665* (2013.01); *H01L 29/41733* (2013.01); *H01L 29/42392* (2013.01); *H01L 29/45* (2013.01); *H01L 29/66545* (2013.01); *H01L 29/66742* (2013.01); *H01L 29/78618* (2013.01); *H01L 29/78642* (2013.01); *H01L 29/78696* (2013.01)

(58) Field of Classification Search
CPC ..... H01L 21/823807; H01L 21/823814; H01L 21/823871; H01L 21/823885; H01L 29/045; H01L 29/0665; H01L 29/41733; H01L 29/42392; H01L 29/45; H01L 29/66545; H01L 29/66742; H01L 29/78618; H01L 29/78642; H01L 29/78696; H01L 21/823828; H01L 21/8221; H01L 27/0688; H01L 27/092; H01L 29/165; H01L 29/42376; H01L 29/7827; H01L 29/66666
USPC ...................................................... 257/329
See application file for complete search history.

(56) References Cited

FOREIGN PATENT DOCUMENTS

| | | |
|---|---|---|
| CN | 107887387 | 4/2018 |
| JP | 0878533 | 3/1996 |

OTHER PUBLICATIONS

Second Chinese Office Action, issued in the corresponding Chinese patent application No. 201811265733.2, dated Aug. 5, 2020, 21 pages.

Third Chinese Office Action, issued in the corresponding Chinese patent application No. 201811265733.2, dated Oct. 28, 2020, 6 pages.

International Search Report and Written Opinion, issued in the corresponding PCT application No. PCT/CN2018/113049, dated Jul. 26, 2019, 6 pages.

* cited by examiner

SEMICONDUCTOR DEVICE, MANUFACTURING METHOD THEREOF, AND ELECTRONIC DEVICE INCLUDING THE DEVICE

CROSS REFERENCE TO RELATED APPLICATIONS

This application claims priority to Chinese Patent Application No. 201811265733.2 and entitled "semiconductor device, manufacturing method thereof, and electronic device including the device" filed on Oct. 26, 2018, which is incorporated herein by reference in its entirety.

TECHNICAL FIELD

The present disclosure relates to a field of semiconductors, and in particular to a vertical semiconductor device and a manufacturing method thereof, and an electronic device including the semiconductor device.

BACKGROUND

In a horizontal device such as a metal oxide semiconductor field effect transistor (MOSFET), source, gate, and drain are arranged in a direction substantially parallel to a surface of a substrate. Due to this arrangement, an area occupied by the horizontal device is reduced, and areas occupied by the source, drain and gate are generally required to be reduced, making device performance worse (for example, the power consumption and resistance increase), such that it is not easy for the area of the horizontal device to be further reduced. In contrast, in a vertical device, the source, gate, and drain are arranged in a direction substantially perpendicular to a surface of the substrate. Therefore, compared to the horizontal device, it is easier for an area occupied by the vertical device to be reduced.

SUMMARY

In view of this, an object of the present disclosure is at least to provide a vertical semiconductor device capable of effectively reducing the occupied area, a manufacturing method thereof, and an electronic device including the semiconductor device.

According to one aspect of the present disclosure, there is provided a semiconductor device, including: a substrate; a first device and a second device that are sequentially stacked on the substrate, each of the first device and the second device comprising: a first source/drain layer, a channel layer, and a second source layer that are sequentially stacked from bottom to top, and a gate stack around at least a part of an outer periphery of the channel layer, wherein sidewalls of the respective channel layers of the first device and the second device extend at least partially along different crystal planes or crystal plane families.

According to another aspect of the present disclosure, there is provided a method of manufacturing a semiconductor device, including: sequentially stacking, from bottom to top, a first source/drain layer, a channel layer and a second source/drain layer of a first device, and a first source/drain layer, a channel layer and a second source of a second device on a substrate; defining active regions of corresponding devices in the first source/drain layer, channel layer, and second source/drain layer of the first device, and the first source/drain layer, channel layer and second source/drain layer of the second semiconductor device, such that a sidewall of the channel layer of the first device and a sidewall of the channel layer of the second device extend at least partially along different crystal planes or crystal plane families; and forming respective gate stacks of the first device and the second device each around at least a part of outer peripheries of respective channel layers of the first device and the second device.

According to another aspect of the present disclosure, there is provided an electronic device including an integrated circuit formed at least partially by the above semiconductor device.

According to embodiments of the present disclosure, the semiconductor device includes vertical devices stacked on top of each other, which may greatly reduce area and save space. The gate stack is formed around at least a part of the outer periphery of the channel layer and a channel is formed in the channel layer, such that a gate length may be determined by a thickness of the channel layer, and the gate length can be better controlled. In addition, sidewalls of the respective channel layers of different devices may be arranged to extend at least partially along different crystal planes or crystal plane families. Since carriers may have different mobility in directions of different crystal planes or crystal plane families, the carrier mobility in the channel layers of different devices may be adjusted, and a conductive effect of different devices may be adjusted to optimize an overall performance of the semiconductor device.

BRIEF DESCRIPTION OF THE DRAWINGS

Through the description described below with reference to the drawings of the embodiments of the present disclosure, the above and other objectives, features, and advantages of the present disclosure will be clearer.

Figure 1:
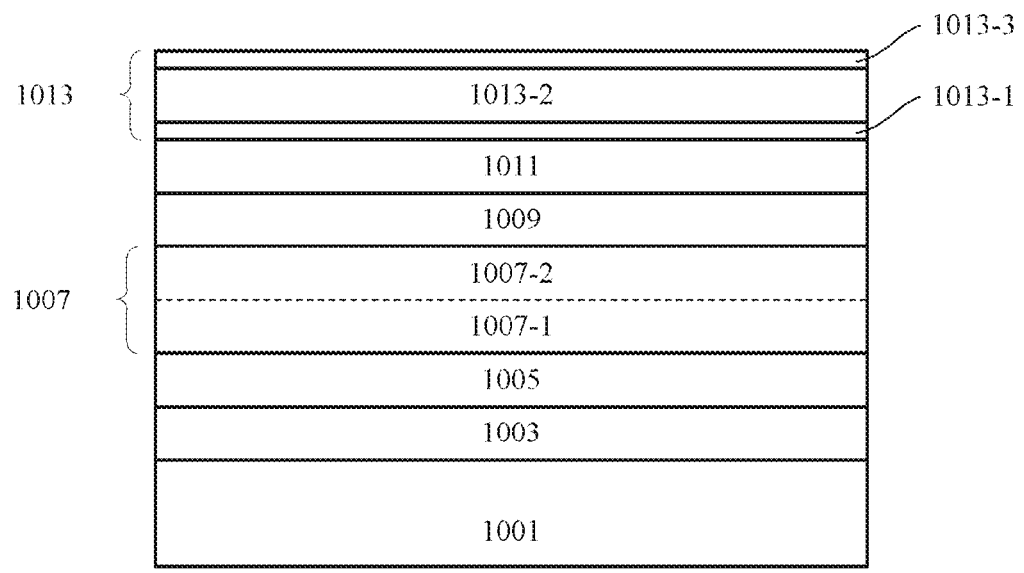
FIGS. 1-25 show schematic diagrams of a process of manufacturing a semiconductor device according to an embodiment of the present disclosure.

Throughout the drawings, the same or similar reference signs represent the same or similar components.

DETAILED DESCRIPTION

Hereinafter, embodiments of the present disclosure will be described with reference to the drawings. However, it should be understood that these descriptions are only exemplary and illustrative, and are not intended to limit the present disclosure. In addition, in the following description, descriptions of well-known structures and technologies are omitted herein to avoid unnecessarily obscuring concepts of the present disclosure.

The drawings show various structural schematic diagrams according to embodiments of the present disclosure. The drawings are not drawn to scale, some details are enlarged and some details may be omitted for clarity of presentation. Shapes of the various regions and layers shown in the drawings and the relative size and positional relationship thereof are only exemplary. In practice, there may be deviations due to manufacturing tolerances or technical limitations. Regions/layers with different shapes, sizes, and relative positions may be designed by those ordinary skilled in the art as needed. In addition, singular forms are intended to include the plural forms as well, unless the context clearly indicates otherwise.

In the context of the present disclosure, when a layer/element is referred to as being "on" another layer/element, the layer/element may be directly on the another layer/element, or there may be an intermediate layer/element there between. In addition, if a layer/element is located "on" another layer/element in one orientation, the layer/element may be located "under" the another layer/element when the orientation is reversed.

A semiconductor device according to an embodiment of the present disclosure may include a first device and a second device that are sequentially stacked on the substrate. The first device and the second device are both vertical devices. The vertical devices may include a first source/drain layer, a channel layer, and a second source/drain layer that are sequentially stacked. A source/drain region of the device may be formed in the first source/drain layer and the second source/drain layer, and a channel region of the device may be formed in the channel layer. A space formed between the source/drain regions located at both ends of the channel region may form a conductive channel through the channel region. Active region stack configurations of different vertical devices may be the same or be different.

According to embodiments of the present disclosure, the sidewalls of the channel layer of different devices, especially devices of different conductivity types, may extend at least partially along different crystal planes or crystal plane families. Since carriers may have different mobility in directions of different crystal planes or crystal plane families, the carrier mobility in the channel layers of different devices may be adjusted, and a conductive effect of different devices may be adjusted to optimize an overall performance of the semiconductor device. For example, in the case where the channel layer includes a single crystal semiconductor material or one of Si, SiGe or Ge crystals, at least a part of a sidewall of a channel layer of an n-type device may extend along a (100) crystal plane or a {100} crystal plane family, because the crystal plane or the crystal plane family is conducive to mobility of electrons; and at least part of a sidewall of a channel layer of a p-type device may extend along a (110) crystal plane or a {110} crystal plane family, because the crystal plane or the crystal plane family is conducive to mobility of holes. In addition, when devices are of different conductivity types, a complementary metal oxide semiconductor (CMOS) configuration may be formed.

According to an embodiment of the present disclosure, not all sidewalls of the channel layer can be optimized (that is, allowing all of the sidewalls to extend along a desired crystal plane or crystal plane family), but only a part of the sidewalls can be optimized. For example, in order to improve device reliability and reduce process fluctuations, the channel layer may be chamfered. At this time, a rounded part of the sidewall may not extend along the desired crystal plane or crystal plane family. For another example, a sidewall with a larger area among the sidewalls of the channel layer may be optimized, and an influence of a sidewall with a smaller area may be ignored, for example, in the case of nanosheets. In this case, the crystal plane of the sidewall is not a single crystal plane family.

According to an embodiment of the present disclosure, a direction from the first source/drain layer of the device toward the second source/drain layer of the device may be along a direction of a [100] crystal orientation or along a <100> crystal orientation family, which is parallel to a {100} crystal plane family and a {110} crystal plane family, that is, the {100} crystal plane family and {110} crystal plane family are perpendicular to the substrate, so that the sidewall of the channel layer extending along the {100} crystal plane family or {110} crystal plane family are perpendicular to the substrate.

When the sidewall of the channel layer extends along the crystal plane or crystal plane family, a sharp corner may be formed between adjacent sidewalls of the channel layer. Such a sharp corner is not stable, and may reduce the reliability of the device and cause fluctuations in device performance. To this end, the channel layer may be chamfered, so that the corner formed by the adjacent sidewalls of the channel layer may be a relatively gentle rounded corner.

The channel layer may be made of a single crystal semiconductor material to improve device performance, such as reducing channel resistance. Single crystal semiconductor materials of the channel layers of different devices may have the same crystal orientation, and/or may have the same crystal structure. In this way, the channel layers of these devices may be manufactured with the same base, which is convenient to be manufactured and with fewer defects.

Certainly, the first and second source/drain layers may also be made of a single crystal semiconductor material. In this case, a single crystal semiconductor material of the channel layer and a single crystal semiconductor material of the source/drain layer may be eutectic. A mobility of the electrons or holes of the single crystal semiconductor material of the channel layer may be greater than a mobility of the electrons or holes of the first and second source/drain layers. In addition, a band gap of the first and second source/drain layers may be larger than a band gap of the single crystal semiconductor material of the channel layer.

The gate stack may be formed around at least a part of the outer periphery of the channel layer. Therefore, the gate length may be determined by a thickness of the channel layer itself, rather than being determined by etching time as in the conventional technology. The channel layer may for example be formed by epitaxial growth, so that its thickness may be well controlled. Therefore, the gate length may be well controlled.

According to an embodiment of the present disclosure, the gate stack may be self-aligned to the channel layer. For example, the gate stack and the channel layer may be substantially coplanar. Specifically, a space occupied by the gate stack may be defined by an interface between the channel layer and the first and second source/drain layers. In this case, at least a part of an upper surface of the gate stack may be substantially coplanar with an upper surface of the channel layer, and at least a part of a lower surface of the gate stack may be substantially coplanar with a lower surface of the channel layer. In this way, an overlapping of the gate stack and the source/drain region may be reduced or even avoided, which helps to reduce a parasitic capacitance between the gate and the source/drain.

According to an embodiment of the present disclosure, the channel layer may have an etching selectivity with respect to the source/drain layer, for example, the channel layer may include different semiconductor materials. In this way, it is beneficial to process the channel layer and the source/drain layer separately, such as by selective etching. In addition, the first source/drain layer and the second source/drain layer may include the same semiconductor material.

According to an embodiment of the present disclosure, lateral sizes of the first and second source/drain layers may be greater than a lateral size of the channel layer, so that an outer periphery of the channel layer may be recessed inward with respect to outer peripheries of the first and second source/drain layers, and the formed gate stack may be embedded in a recess of the channel layer recessed with respect to the first and second source/drain layers. According to another embodiment of the present disclosure, the lateral sizes of the first and second source/drain layers may not be greater than the lateral size of the channel layer, so that a facing area of the formed gate stack and source/drain region may be reduced, which helps to reduce an overlapping capacitance between the gate and the source/drain. In a top view, the first source/drain layer, the channel layer, and the second source/drain layer of the second device may be within a range of the second source/drain layer of the first device.

The first device and the second device may be electrically connected to each other. For example, the electrical connection may be formed by a manner in which the second source/drain layer of the first device and the first source/drain layer of the second device are contiguous to each other, that is, in a direct physical contact. In this case, the second source/drain layer of the first device and the first source/drain layer of the second device may even be integral, that is, they may be provided by a same semiconductor layer.

Since the first device and the second device are both vertical devices and are stacked on top of each other, except for the second source/drain layer of the second device at the top, remaining source/drain layers (in which a source/drain region of the device is formed) and the gate stack formed around the channel layer cannot directly form electrical contacts respectively there above. Therefore, in order to form an electrical connection to the first device and the second device, electrical contacts, which deviate in a lateral direction and electrically connect to the first device and the second device through laterally extending parts, may be formed. For example, the gate stack (specifically, a gate conductor therein) formed around the outer periphery of the channel layer may include a laterally extending portion which extends laterally outward from a corresponding recess, and the laterally extending portion may extend beyond a defined outer periphery of the active region, such that an electrical contact to the laterally extending portion may be formed there above. For the second source/drain layer of the first device and the first source/drain layer of the second device, an electrical contact layer adjacent thereto may be provided. The electrical contact layer may surround the outer peripheries of the second source/drain layer of the first device and the first source/drain layer of the second device to reduce a contact resistance. A portion of the electrical contact layer (referred to as "a laterally extending portion") may extend laterally with respect to a remaining portion, and may extend beyond the defined active region, such that an electrical contact to the laterally extending portion may be formed there above. The first source/drain layer of the first device at the bottom may be patterned such that a lower portion extends beyond an outer periphery of an upper portion, therefore an electrical contact to the lower portion may be formed there above.

Since there are a plurality of laterally extending portions, at least some of the laterally extending portions may extend laterally in different directions to avoid mutual interference between corresponding electrical contacts. If at least some of the laterally extending portions overlap in a vertical direction, then among the overlapped laterally extending portions, a lower one may extend beyond an upper one to avoid mutual interference of the corresponding electrical contacts.

For example, such a semiconductor device may be manufactured as follows. Specifically, a first source/drain layer, a channel layer, and a second source/drain layer of the first device and a first source/drain layer, a channel layer, and a second source/drain layer of the second device may be sequentially stacked on a substrate from bottom to top. For example, the layers may be provided by epitaxial growth. During the epitaxial growth, a thickness of the grown channel layer may be controlled. In addition, as described above, the second source/drain layer of the first device and the first source/drain layer of the second device may be integral, that is, be the same layer. Due to respective epitaxial growth, at least a pair of adjacent layers may have a clear crystal interface therebetween. In addition, each layer may be doped differently, so the at least a pair of adjacent layers may have a doping concentration interface therebetween.

For the above stacked layers, an active region may be defined therein. For example, the active region may be selectively etched into desired shapes sequentially. The etching may be sequentially performed on each layer from top to bottom. As described above, in order to facilitate a connection to source/drain regions formed in the first source/drain layer of the first device at the bottom in a subsequent process, etching of the layer may only be performed to an upper portion of the layer, so that a lower portion of the layer may extend beyond an outer periphery of the upper portion. Afterwards, a gate stack may be formed around the outer periphery of the channel layer.

According to an embodiment of the present disclosure, a sidewall of the channel layer may be formed along a certain crystal plane or crystal plane family. Certainly, a same mask is usually used when the active region is defined, so sidewalls of the first source/drain layer and the second source/drain layer may also extend along the same crystal plane or crystal plane family. Thus, the active region may have a square column shape. In addition, in the first device and the second device, especially when they have different conductivity types, the sidewalls of their respective channel layers may extend at least partially along different crystal planes or crystal plane families.

When the sidewalls of the channel layers of the first device and the second device at least partially extend along different crystal planes or crystal plane families, they may be respectively patterned by using different masks. For example, a first mask in which at least a part of the sidewall extends along a desired crystal plane or crystal plane family may be used to pattern an active region of the second device, and a second mask in which at least a part of the sidewall extends along a different desired crystal plane or crystal plane family may be used to pattern an active region of the first device. Since the patterning is performed from top to bottom, a boundary of the first mask may be within a range of a boundary of the second mask, so as to avoid the active region of an upper second device from hindering the patterning of the active region of a lower first device.

In addition, the outer periphery of the channel layer of each device may be recessed inward with respect to outer peripheries of corresponding first and second source/drain layers, so as to define a space for accommodating gate stacks. For example, this may be achieved by a selective etching. Therefore, the gate stack may be embedded in the recess. In order to keep the sidewall of the channel layer extending along a corresponding crystal plane or crystal plane family, the recess of the channel layer may be formed by an isotropic etching.

To improve the reliability of the device, a sharp corner formed between the adjacent sidewalls of the channel layer may be gently rounded.

Source/drain regions may be formed in the first and second source/drain layers of each device. For example, this may be achieved by doping the first and second source/drain layers. For example, ion implantation, plasma doping may be performed, or in-situ doping may be performed when the first and second source/drain layers are grown. According to a preferred embodiment, a sacrificial gate may be formed in a recess formed in an outer periphery of the channel layer recessed with respect to outer peripheries of the first and second source/drain layers, and then a dopant source layer is formed on surfaces of the first and second source/drain layers, and dopants in the dopant source layer are brought into an active region via the first and second source/drain layers by, for example, annealing. The sacrificial gate may prevent the dopants in the dopant source layer from directly entering into the channel layer. However, a part of the dopants may still enter into ends of the channel layer close to the first source/drain layer and the second source/drain layer via the first and second source/drain layers, thereby forming a certain doping distribution at the ends of the channel layer close to the first source/drain layer and the second source/drain layer, which helps to reduce a resistance between the source/drain region and the channel region when the device is turned on, thereby improving the device performance. For the first device and the second device, operations of forming the source/drain regions may be performed together (for example, in the case where their respective source/drain regions have the same or similar doping characteristic), or may be performed separately (for example, in the case where their respective source/drain regions have different doping characteristics). In a subsequent manufacturing process, the sacrificial gate in the recess formed in the outer periphery of the channel layer recessed with respect to the outer peripheries of the first and second source/drain layers may be removed, and a gate stack for a corresponding device may be formed in a corresponding recess.

In the above top-down etching process, after forming a sacrificial gate of the second device and before defining the active region of the first device, a protective layer may further be formed on surfaces of the first and second source/drain layers of the second device, so as to protect the formed active region of the second device from being affected by the subsequent processing. In addition, after forming the sacrificial gates of the first device and the second device, the source/drain layers may further be silicidated in order to reduce contact resistance.

The present disclosure may be presented in various forms, some examples of which will be described below.

FIGS. 1-25 show schematic diagrams of a process of manufacturing a semiconductor device according to an embodiment of the present disclosure.

As shown in FIG. 1, a substrate 1001 is provided. The substrate 1001 may be a substrate in various forms, including but not limited to a substrate including bulk semiconductor material such as a bulk Si substrate, a semiconductor on insulator (SOI) substrate, a compound semiconductor substrate such as a SiGe substrate, and the like. In the following description, for convenience of description, a bulk Si substrate is described as an example. According to an embodiment of the present disclosure, the substrate 1001 may include a (100) single crystal silicon, a single crystal silicon germanium, or a single crystal germanium wafer. At this time, there are both a crystal plane of a {100} crystal plane family and a crystal plane of a {110} crystal plane family in crystal planes perpendicular to a (100) crystal plane, which is conducive to manufacturing of the following devices.

On the substrate 1001, a first source/drain layer 1003, a channel layer 1005, a second source/drain layer 1007, a second channel layer 1009 and a third source/drain layer may be sequentially formed by, for example, epitaxial growth. For example, for a p-type device, the first source/drain layer 1003 may include a suitable semiconductor material such as SiGe (an atomic percentage of Ge may be about 10-40%) with a thickness of about 20-50 nm; the channel layer 1005 may include a semiconductor material different from the first source/drain layer 1003 and the second source/drain layer 1007, such as Si, with a thickness of about 10-100 nm; the second source/drain layer 1007 may include the same material as the first source/drain layer 1003, such as SiGe (an atomic percentage of Ge may be about 10-40%); the second channel layer 1009 may include a semiconductor material different from the second source/drain layer 1007 and the third source/drain layer 1011, such as Si, with a thickness of about 10-100 nm; the third source/drain layer 1011 may include the same material as the second source/drain layer 1007, such as SiGe (an atomic percentage of Ge may be about 10-40%) with a thickness of about 20-50 nm. The materials selected for the source/drain layers and the channel layers are not limited thereto, and may include other semiconductor materials that may provide an appropriate etching selectivity. For example, each channel layer may include semiconductor materials with the same composition as the source/drain layer below or above it, but with different component contents (for example, with the same material SiGe, but their atomic percentages of Ge are different), as long as the channel layer has an etching selectivity with respect to the source/drain layer below or above it.

In this example, the first source/drain layer 1003, the first channel layer 1005 and a lower portion 1007-1 (for example, with a thickness of about 10-50 nm) of the second source/drain layer 1007 are used to define an active region of a first device, and an upper portion 1007-2 of the second source/drain layer 1007 (for example, with a thickness of about 10-50 nm), the second channel layer 1009 and the third source/drain layer 1011 are used to define an active region of a second device. Here, the first device and the second device are contiguous to each other and share the same source/drain layer 1007. However, the present disclosure is not limited thereto. For example, the source/drain layer 1007-1 for the first device and the source/drain layer 1007-2 for the second device may be grown separately, and they may include the same or different semiconductor materials. Furthermore, the first device and the second device are not contiguous with each other, but have a dielectric layer therebetween so that they are electrically isolated from each other. For example, a dielectric layer may be additionally deposited between the source/drain layer 1007-1 for the first device and the source/drain layer 1007-2 for the second device.

When the source/drain layers 1003, 1007 and 1011 are grown, they may be doped in-situ to subsequently form source/drain regions. For example, for an n-type device, an n-type doping may be performed; for a p-type device, a p-type doping may be performed.

In addition, when the channel layers 1005 and 1009 are grown, they may also be doped in situ to adjust a threshold voltage ($V_t$) of the device. For example, for the n-type device, the p-type doping may be performed with a doping concentration of about 1E17-1E19 $cm^{-3}$; for the p-type device, the n-type doping may be performed with a doping concentration of about 1E17-1E19 $cm^{-3}$.

In addition, for a junctionless device, the source/drain layers 1003, 1007, 1011 and the channel layers 1005, 1009 may be doped with the same type.

In this example, the first source/drain layer 1003 is additionally grown on the substrate 1001. However, the present disclosure is not limited thereto. For example, a first source/drain layer may be formed by the substrate 1001 itself. In this case, a well region may be formed in the substrate 1001 to form source/drain regions therein.

In addition, for purposes to facilitate a patterning in a subsequent process and provide an appropriate stop layer and so on, a hard mask 1013 may further be formed on the grown semiconductor layers. In this example, the hard mask 1013 may include a first hard mask layer 1013-1, a second hard mask layer 1013-2 and a third hard mask layer 1013-3 that are sequentially stacked. For example, the first hard mask layer 1013-1 may include an oxide (such as silicon oxide) with a thickness of about 2-10 nm; the second hard mask layer 1013-2 may include nitride (such as silicon nitride) with a thickness of about 10-100 nm; the third hard mask layer 1013-3 may include an oxide with a thickness of about 20-100 nm. The stacking configuration of the hard mask 1013 is mainly to provide a suitable etching selectivity in the subsequent process, and other configurations are obvious for those ordinary skilled in the art.

Figure 2A:
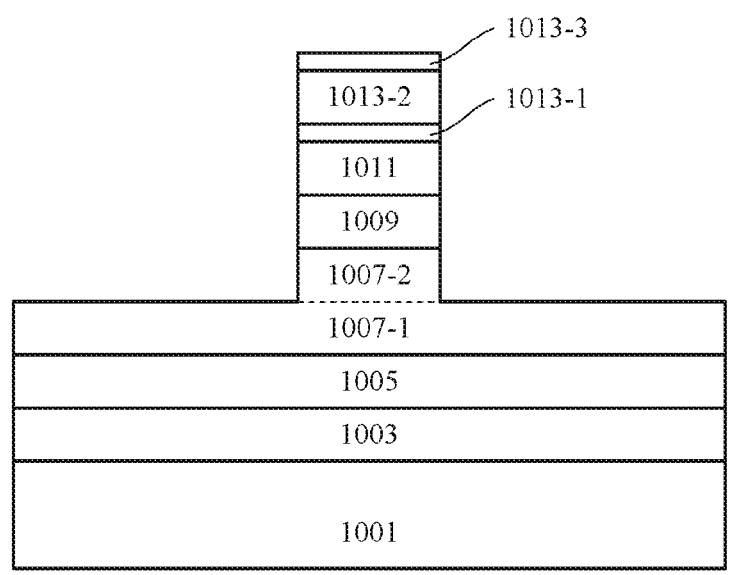
Figure 2B:
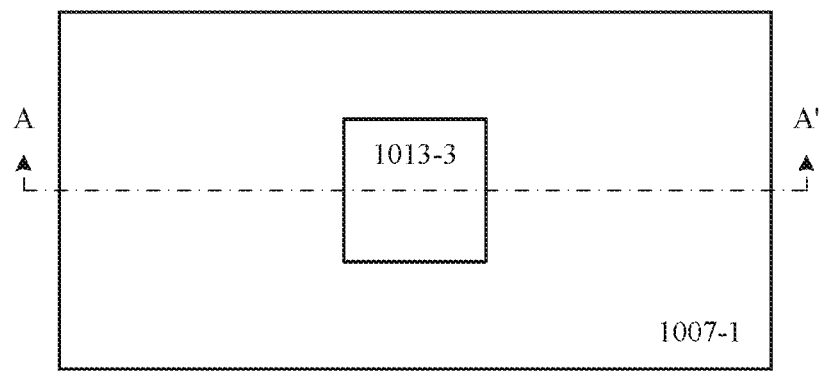

Next, active regions of the device may be defined. For example, this can be done as follows. Specifically, as shown in FIGS. 2(a) and 2(b) (FIG. 2(a) is a cross-sectional view, FIG. 2(b) is a top view, where line AA' shows an interception position of the cross section), a photoresist (not shown) may be formed on the hard mask 1013, and the photoresist is patterned into a desired shape (in this example, a roughly rectangular) by photolithography (exposure and development). Here, in order to enhance performance of the semiconductor device, a photoresist pattern may be etched according to different directions of the crystal plane or crystal plane family based on a type of the device. In this example, assuming that the second device is an n-type device, it is expected that at least a part of the sidewall of the channel thereof extends along a (100) crystal plane or a {100} crystal plane family, therefore a corresponding photoresist may be patterned into a substantially rectangular pattern in which at least a part or all of the sidewalls extends along a (100) crystal plane or a {100} crystal plane family of the substrate 1001 (because the channel layer is epitaxially grown on the substrate 1001, the sidewall also extends along a (110) crystal plane or a {110} crystal plane family of the channel layer).

Afterwards, a shape of the patterned photoresist may be transferred to the hard mask 1013. For example, the third hard mask layer 1013-3, the second hard mask layer 1013-2 and the first hard mask layer 1013-1 may be sequentially subjected to selective etching such as reactive ion etching (RIE). Then, the third source/drain layer 1011, the second channel layer 1009 and the second source/drain layer 1007 may be sequentially subjected to selective etching such as RIE. The etching proceeds to the second source/drain layer 1007, but not to a bottom surface of the second source/drain layer 1007, so that the upper portion 1007-2 of the second source/drain layer is patterned to correspond to a shape of the hard mask, and the lower portion 1007-1 is basically unchanged. Thus, after the etching, square columns are formed on the third source/drain layer 1011, the second channel layer 1009, and the upper portion 1007-2 of the second source/drain layer. The RIE, for example, may be performed in a direction substantially perpendicular to the surface of the substrate, so that the square columns are also substantially perpendicular to the surface of the substrate. Afterwards, the photoresist may be removed.

As shown in FIG. 2(b), after the etching, the sidewalls of the third source/drain layer 1011, second channel layer 1009, and upper portion 1007-2 of the second source/drain layer extend at least partially along a (110) crystal plane or a {110} crystal plane family.

Certainly, in other embodiments, the second device may also be a p-type device. When the second device is a p-type device, the photoresist may be patterned such that the sidewalls at least partially extend parallel to a (110) crystal plane or a {110} crystal plane family. Thus, after the etching, the sidewalls of the third source/drain layer 1011, the second channel layer 1009, and the upper portion 1007-2 of the second source/drain layer extend at least partially along the (110) crystal plane or the {110} crystal plane family.

Figure 3A:
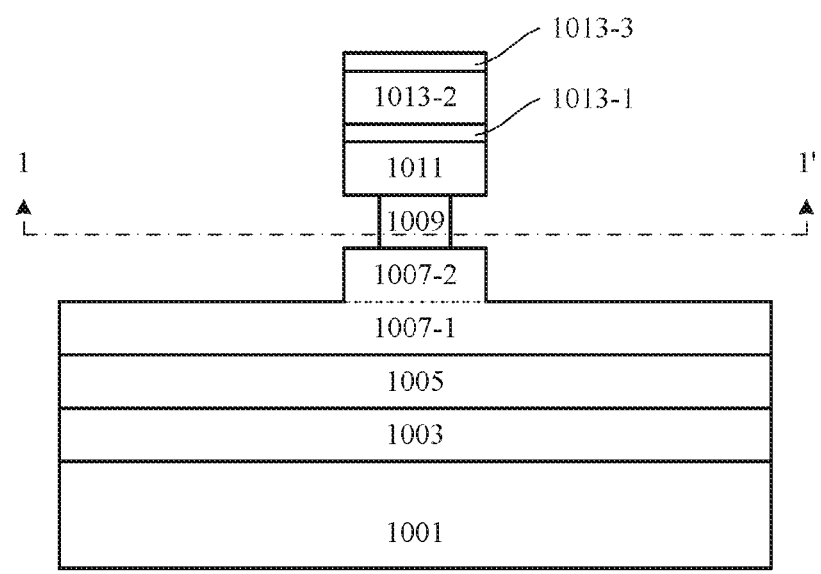
Figure 3B:
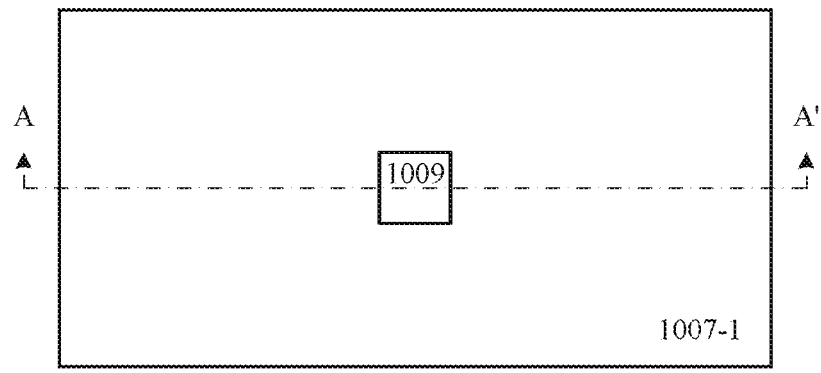

Next, as shown in FIGS. 3(a) and 3(b) (wherein FIG. 3(a) is a front cross-sectional view, FIG. 3(b) is a top cross-sectional view, where line 11' shows an interception position of the top cross section, and line AA' shows an interception position of the front cross section), an outer periphery of the second channel layer 1009 may be recessed with respect to the upper portion 1007-2 of the second source/drain layer and an outer periphery of the third source/drain layer 1011 (in this example, recessed along a lateral direction substantially parallel to the surface of the substrate). The recessed upper and lower sidewalls are defined by interfaces between the second channel layer 1009 and the second source/drain layer 1007 and between the second channel layer 1009 and the third source/drain layer 1011, respectively. For example, this may be achieved by further isotropically and selectively etching the second channel layer 1009 with respect to the second source/drain layer 1007 and the third source/drain layer 1011. For example, atomic layer etching (ALE) or digital etching may be used to perform the selective etching so as to control an amount of etching more accurately.

In this way, active regions (after the etching, the upper portion 1007-2 of the second source/drain layer, the second channel layer 1009 and the third source/drain layer 1011) of the second device are defined. In this example, the active region has a substantially square column shape. In the active region, outer peripheries of the upper portion 1007-2 of the second source/drain layer and the third source/drain layer 1011 are substantially aligned with each other, while an outer periphery of the second channel layer 1009 is relatively recessed. As shown in FIG. 3(b), due to the isotropic etching, the second channel layer 1009 basically remains conformal before and after the etching, and thus has a square column shape with a smaller lateral size, and the sidewall thereof remains to at least partially extend along a (100) crystal plane or a {100} crystal plane family.

As shown in FIG. 3(b), the sidewall of the second channel layer 1009 extends along a (110) crystal plane or the {110} crystal plane family, so that a sharp corner is formed between adjacent sidewalls. Such a sharp corner may be damaged in subsequent processes, resulting in process instability, degradation of device reliability, and fluctuations in device performance. To this end, the sharp corner may be chamfered to become rounded. For example, the sharp corner may be rounded by oxidation (and the oxide layer is removed subsequently).

Figure 4:
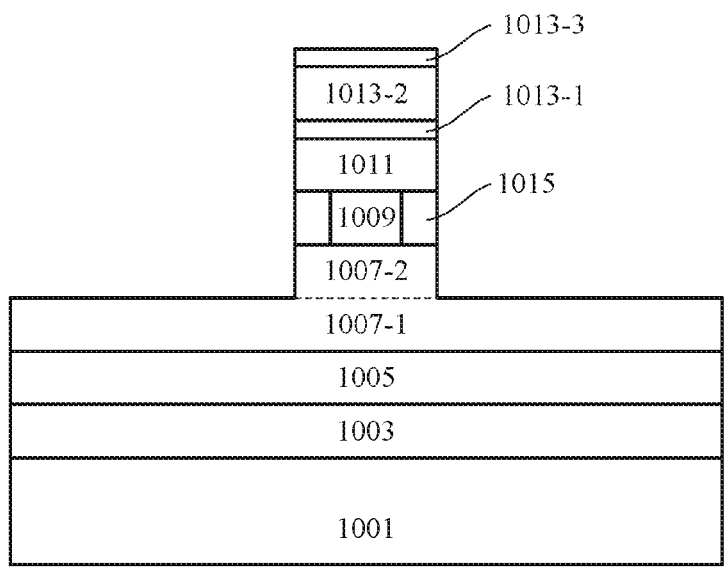

In the recess formed by the second channel layer 1009 recessed with respect to the upper portion 1007-2 of the second source/drain layer and third source/drain layer 1011, a gate stack will be formed subsequently. To prevent the subsequent process from affecting the channel layer 1009 or leaving unnecessary material in the recess and thus affecting the formation of a subsequent gate stack, a material layer may be filled in the recess to occupy the space of the gate stack (therefore, this material layer may be called as "a sacrificial gate"). For example, this may be achieved by depositing nitride on the structure shown in FIGS. 3(*a*) and 3(*b*), and then etching back, such as RIE, the deposited nitride. The RIE may be performed in a direction substantially perpendicular to the surface of the substrate, and the nitride may be left only in the recess to form a sacrificial gate 1015, as shown in FIG. 4. In this case, the sacrificial gate 1015 may substantially fill the above recess.

Figure 5:
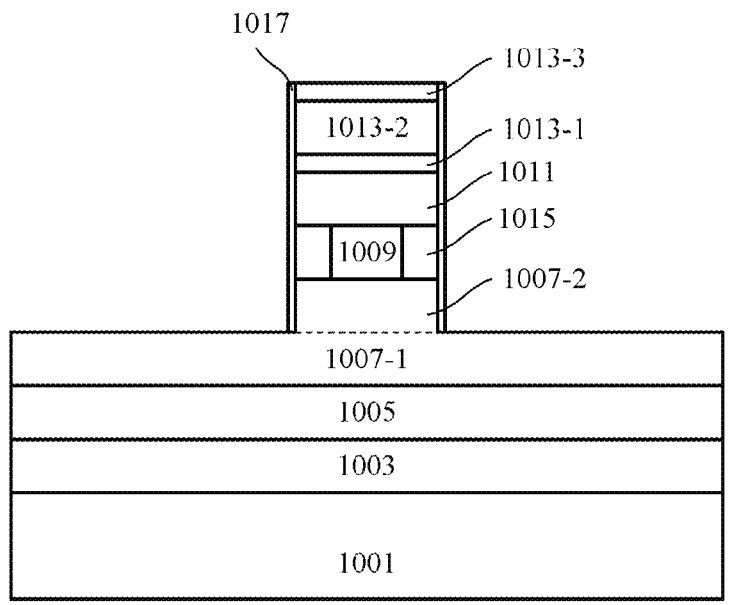

Alternatively, the upper portion 1007-2 of the second source/drain layer and the third source/drain layer 1011 may be further doped, especially when the above in-situ doping concentration is insufficient. Specifically, as shown in FIG. 5, a dopant source layer 1017 may be formed on the structure shown in FIG. 4. For example, the dopant source layer 1017 may include an oxide such as silicon oxide, which contains dopants. An n-type dopant may be contained in an n-type device, and a p-type dopant may be contained in a p-type device. Here, in order to reduce an influence of the dopant source layer 1017 on the lower portion 1007-1 of the second source/drain layer for another device (the first device) (especially in the case where the source/drain regions of the first device and the second device have different doping characteristics), the dopant source layer 1017 may be formed in the form of a spacer on the sidewall of the active region of the second device (due to the presence of the sacrificial gate 1015, the spacer is actually formed on the sidewalls of the upper portion 1007-2 of the second source/drain layer and the third source/drain layer 1011). For example, a thin film may be substantially conformally deposited on the surface of the structure shown in FIG. 4 by, for example, chemical vapor deposition (CVD) or atomic layer deposition (ALD), and then RIE is performed on the thin film in a direction substantially perpendicular to the surface of the substrate, thereby obtaining the dopant source layer 1017 in the form of a spacer.

Figure 6:
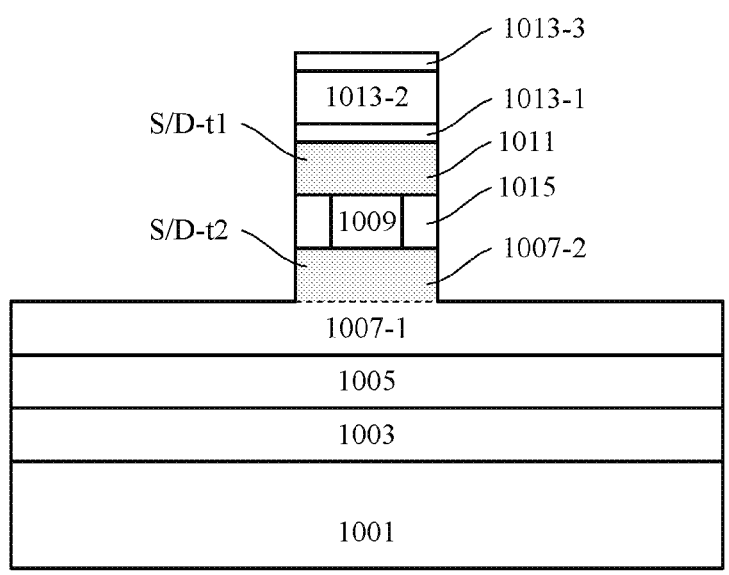

Next, as shown in FIG. 6, in-situ doped impurities may be activated or dopants contained in the dopant source layer 1071 may be further brought into an active region by, for example, annealing, thereby forming a doped region therein, as shown in the shaded part in the figure. More specifically, one source/drain region S/D-t1 of a second semiconductor device may be formed in the third source/drain layer 1011, and another source/drain region S/D-t2 of the second semiconductor device may be formed in the upper portion 1007-2 of the second source/drain layer. Afterwards, the dopant source layer 1017 may be removed.

In addition, despite the presence of the sacrificial gate 1015, the dopants may also enter into the channel layer 1009 via the upper portion 1007-2 of the second source/drain layer and the third source/drain layer 1011, thereby forming a certain doping distribution (not shown in the figure) at upper and lower ends of the channel layer 1009. This doping distribution may reduce a resistance between the source/drain region and the channel when the device is turned on, thereby improving the device performance.

Figure 7A:
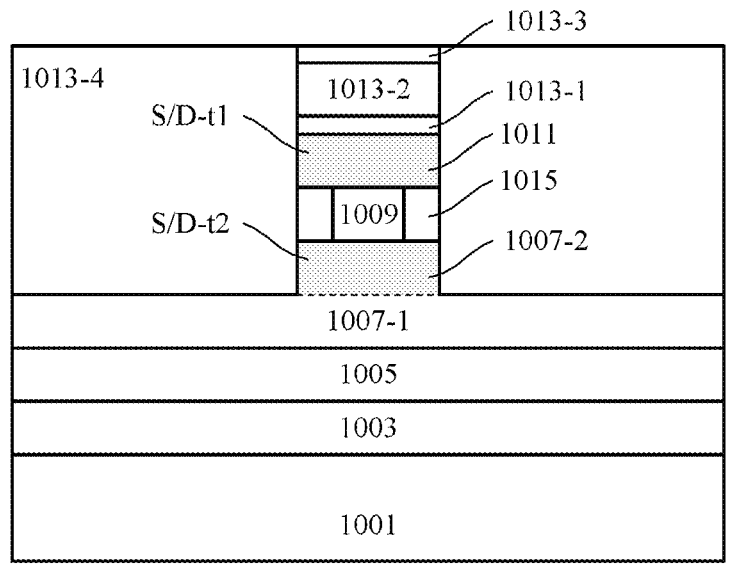
Figure 7B:
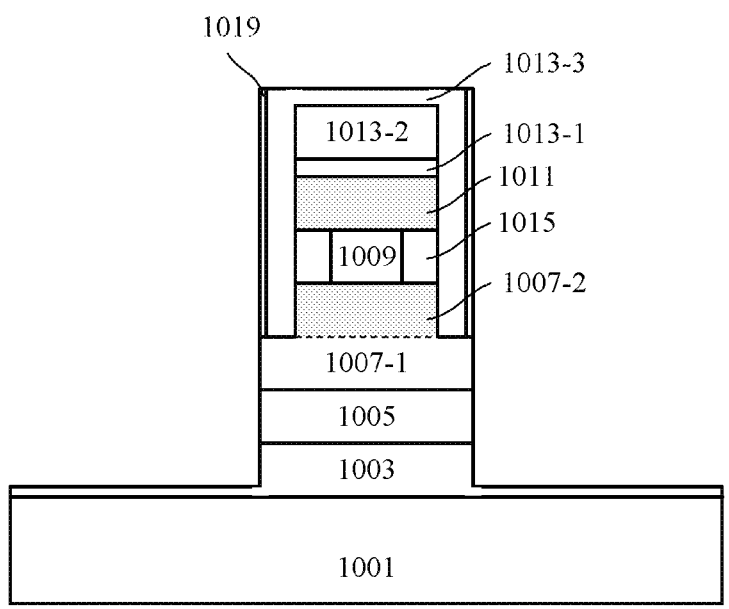

Next, the similar process may be performed on the first device. As shown in FIG. 7(*a*), an oxide 1013-4 is deposited around and above the active region of the second device, and it is subject to a planarization process such as CMP. The planarization process may stop at a second hard mask layer 1013-3 which is integral with the previously existing third hard mask layer 1013-3 (hereinafter is collectively illustrated as 1013-3). The oxide layer may then protect the active region of the second device during the patterning of the active region of the first device.

Next, the active region of the first device may be defined. As shown in FIGS. 7(*b*) and 7(*c*) (wherein FIG. 7(*b*) is a cross-sectional view, FIG. 7(*c*) is a top view, where line AA' shows an interception position of the cross section), a photoresist (not shown) may be formed, and the photoresist is patterned into a desired shape (in this example, a roughly rectangular shape, but has a different orientation from the previous photoresist pattern). In this example, assuming that the first device is of a different type from the second device, such as a p-type device, it is expected that at least a part of the sidewall of the channel extends along a (110) crystal plane or a {110} crystal plane family, so the corresponding photoresist may be patterned into a roughly rectangular pattern in which at least a part or all of the sidewalls extend along a (110) crystal plane or a {110} crystal plane family of the substrate 1001 (because the channel layer is epitaxially grown on the substrate 1001, the sidewall also extends along a (110) crystal plane or a {110} crystal plane family of the channel layer).

In addition, in order to avoid an interference with the active region of the previously formed second device, a range occupied by the patterned photoresist enables the active region of the second device to be completely within the range. In this way, a pattern of the photoresist may be transferred to a lower layer of the active region of the second device.

Then, a shape of the patterned photoresist is transferred to the lower layer. The oxide layer 1013-3, the lower portion 1007-1 of the second source/drain layer 1007, the first channel layer 1005 and the first source/drain layer 1003 may be sequentially subjected to selective etching such as RIE. The etching proceeds to the first source/drain layer 1003, but not to a bottom surface of the first source/drain layer 1003, so that an upper portion of the first source/drain layer 1003 is etched, but a lower portion thereof is basically unchanged. Thus, after the etching, the lower portion 1007-1 of the etched second source/drain layer 1007, the first channel layer 1005 and the first source/drain layer 1003 (or the upper portion thereof) are patterned to correspond to the shape of the photoresist. In this example, the shape is a square column. The RIE, for example, may be performed in a direction substantially perpendicular to the surface of the substrate, so that the square column is also substantially perpendicular to the surface of the substrate. Afterwards, the photoresist may be removed.

According to an embodiment of the present disclosure, in order to protect the active region (especially the source/drain region) of the second device from being affected by subsequent processes (especially to avoid cross-contamination of the dopants), a protective layer 1019 may be formed on an outer periphery of the active region, as shown in FIG. 7(*b*). To this end, when RIE is performed on the oxide layer 1013-3, it may stop at the lower portion 1007-1 of the second source/drain layer 1007. On the sidewall of the oxide layer 1013-3 after the RIE, a protective layer 1019 may be formed. The protective layer 1019 may also be formed in the form of a spacer, for example, SiC or the like. Then, the lower portion 1007-1 of the second source/drain layer 1007, the first channel layer 1005 and the first source/drain layer 1003 are etched.

As described above, in this example, the photoresist is patterned so that at least a part or all of the sidewalls extend along a (110) crystal plane or a {110} crystal plane family. As shown in FIG. 7(*c*), after the etching, the sidewalls of the lower portion 1007-1 of the second source/drain layer 1007, the first channel layer 1005, and the upper portion of the first source/drain layer 1003 extend at least partially along a (110) crystal plane or a {110} crystal plane family.

Figure 7C:
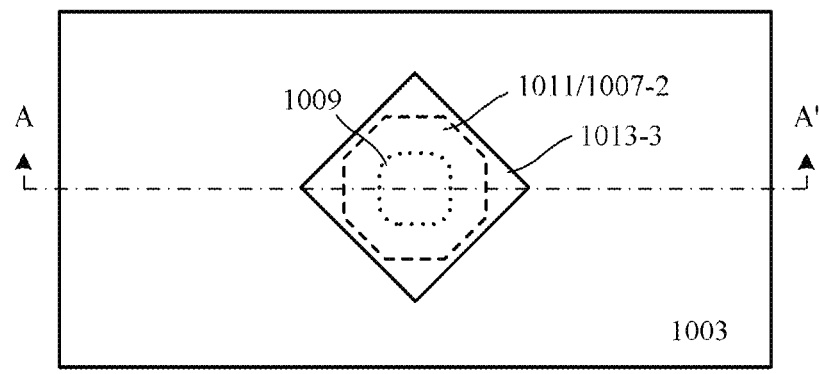

In addition, as shown in FIG. 7(c), when the active region of the first device is defined, the third source/drain layer 1011 of the second device and the upper portion 1007-2 of the second source/drain layer that have been formed may also be affected, such that the third source/drain layer 1011 and the upper portion 1007-2 of the second source/drain layer (as shown in a dotted line in the figure) have a shape that changes from a roughly square column to a roughly octahedral column. Since the second channel layer 1009 (as shown in a dotted line in the figure) has a square column shape with a smaller lateral size, it may not be affected and its sidewall still remains to extend along a (100) crystal plane or a {100} crystal plane family.

According to another embodiment, the first device may also be an n-type device. When the first device is an n-type device, the photoresist may be patterned so that at least a part of the sidewall extends along a direction of a (100) crystal plane or a {100} crystal plane family. Thus, after the etching, the sidewalls of the lower portion 1007-1 of the second source/drain layer 1007, the first channel layer 1005, and the upper portion of the first source/drain layer 1003 extend at least partially along a (100) crystal plane or a {100} crystal plane family.

Figure 8A:
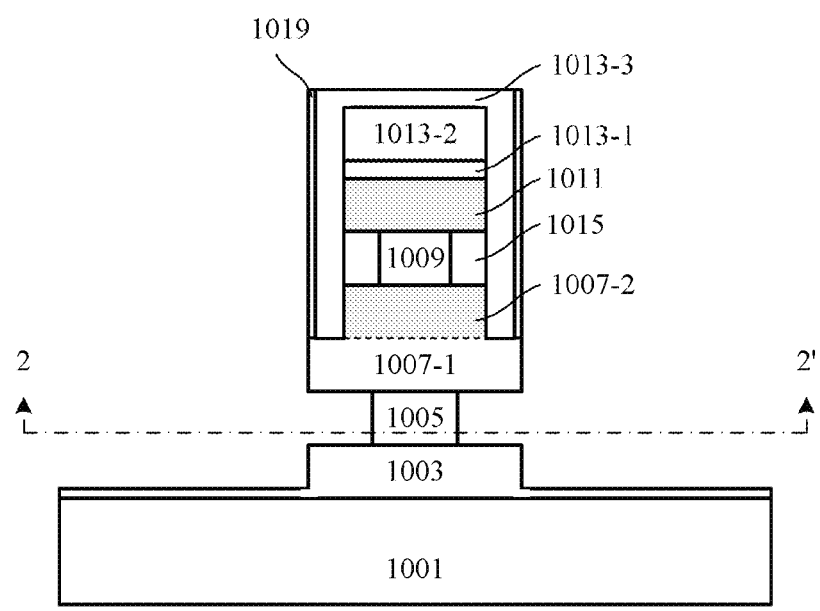
Figure 8B:
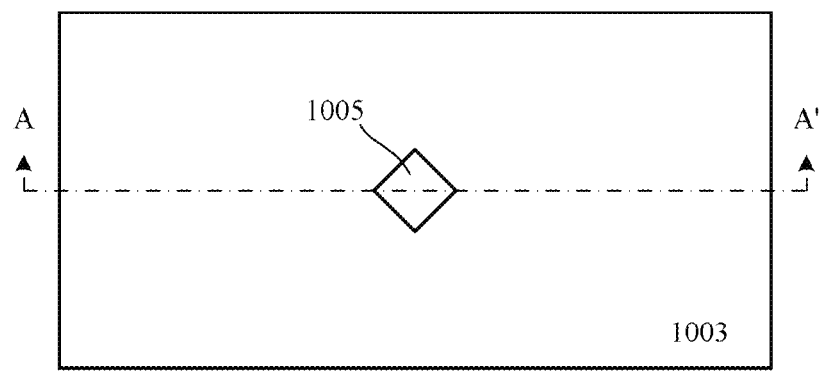

Then, as shown in FIGS. 8(a) and 8(b) (wherein FIG. 8(a) is a front cross-sectional view, FIG. 8(b) is a top cross-sectional view, where line AA' shows an interception position of the front cross section, and line 22' shows an interception position of the top cross section), an outer periphery of the first channel layer 1005 may also be recessed with respect to outer peripheries of the lower portion 1007-1 of the second source/drain layer 1007 and the first source/drain layer 1003 (or the upper portion thereof) (in this example, recessed along a lateral direction substantially parallel to the surface of the substrate). The recessed upper and lower sidewalls are defined by interfaces between the first channel layer 1005 and the second source/drain layer 1007 and between the first channel layer 1005 and the first source/drain layer 1003, respectively. For example, this may be achieved by further isotropically and selectively etching (such as, wet etching using TMAH solution) the channel layer 1003 with respect to the second source/drain layer 1007 and the first source/drain layer 1003. For example, atomic layer etching (ALE) or digital etching may be used to perform the selective etching so as to control an amount of etching more accurately.

In this way, the active region (the etched lower portion 1007-1 of the second source/drain layer, first channel layer 1005 and first source/drain layer 1003) of the first device is defined. In this example, the active region has a substantially square column shape. In the active region, outer peripheries of the lower portion 1007-1 of the second source/drain layer and the first source/drain layer 1003 may be substantially aligned with each other, while an outer periphery of the first channel layer 1005 is relatively recessed. As shown in FIG. 8(b), due to an isotropic etching, the first channel layer 1005 basically remains conformal before and after the etching, and thus has a square column shape with a smaller lateral size, and the sidewall remains to extend at least partially along a (110) crystal plane or a {110} crystal plane family.

As shown in FIG. 8(b), the sidewall of the first channel layer 1005 extends along a (110) crystal plane or a {110} crystal plane family, so that a sharp corner is formed between adjacent sidewalls. Such a sharp corner may be damaged in subsequent processes, resulting in process instability, degradation of device reliability, and fluctuations in the device performance. To this end, the sharp corner may be chamfered to become rounded. For example, the sharp corner may be rounded by oxidation (and the oxide layer is removed subsequently).

Figure 9:
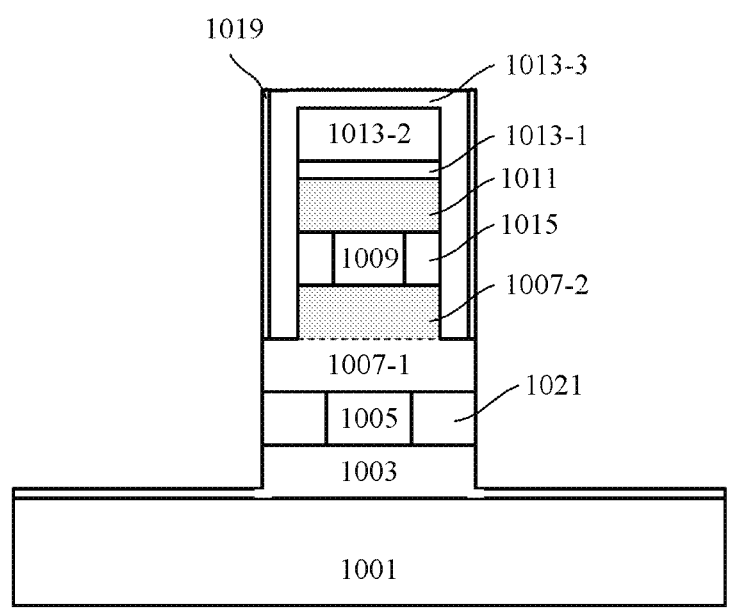

As described above, a sacrificial gate 1021 may be formed in the recess formed by the first channel layer 1005 with respect to the lower portion 1007-1 of the second source/drain layer 1003 and the first source/drain layer 1003, as shown in FIG. 9. For example, the sacrificial gate 1021 may include nitride. As described above, this may be achieved by depositing nitride and etching back. Alternatively, in order to improve selectivity or process control, a thin oxide layer (for example, with a thickness of about 1-5 nm, not shown in the figure) may be deposited before the nitride is deposited.

Figure 10:
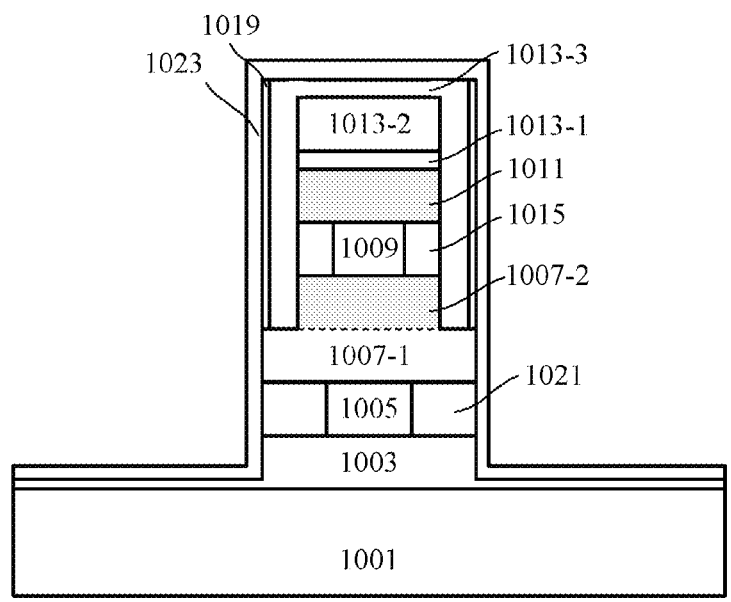

Similarly, the lower portion 1007-1 of the second source/drain layer and the first source/drain layer 1003 may optionally be further doped, especially when the above in-situ doping concentration is insufficient. Specifically, as shown in FIG. 10, a dopant source layer 1023 may be formed on the structure shown in FIG. 9. For example, the dopant source layer 1023 may include an oxide such as silicon oxide, which contains dopants. An n-type dopant may be contained in an n-type device, and a p-type dopant may be contained in a p-type device. Here, the dopant source layer 1023 may be a thin film, so that it may be substantially conformally deposited on a surface of the structure as shown in FIG. 9 by, for example, CVD or ALD.

Figure 11:
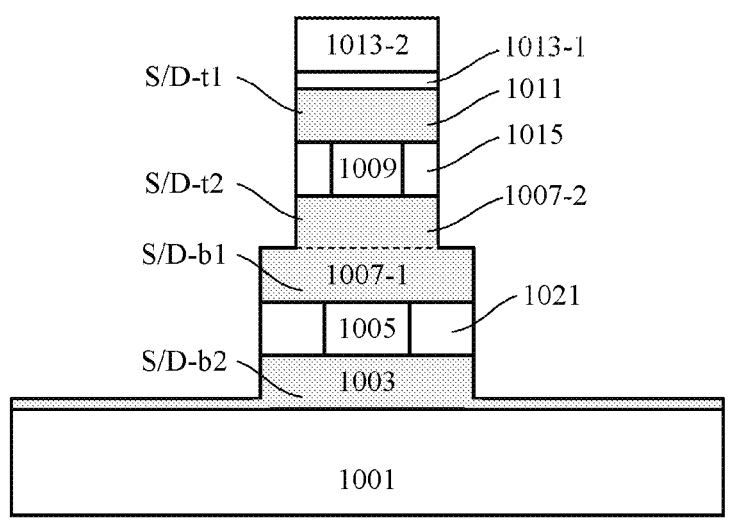

Next, as shown in FIG. 11, in-situ doped impurities may be activated or dopants contained in the dopant source layer 1023 may be further brought into an active region by, for example, annealing, thereby forming a doped region therein, as shown in the shaded part in FIG. 11. More specifically, one of the source/drain regions, S/D-b1, of the first semiconductor device may be formed in the lower portion 1007-1 of the second source/drain layer, and another source/drain region S/D-b2 of the first semiconductor device may be formed in the first source/drain layer 1003. Due to the presence of the protective layer 1019, the dopants contained in the dopant source layer 1023 may be prevented from entering into the active region of the second device. Afterwards, the dopant source layer 1023 and the protective layer 1019 may be removed by, for example, selective etching, and the oxide 1013-3 may also be removed together.

In this example, the dopant source layer 1023 includes a portion extending along a horizontal surface of the lower portion (a portion that is not etched) of the first source/drain layer 1003, so that even a doped region may be formed at the horizontal surface of the lower portion (a portion that is not etched) of the first source/drain layer 1003, and the doped region extends beyond an outer periphery of a columnar active region. In this way, it may be easily electrically connected to the source/drain region S/D-b2 through the doped region in a subsequent process.

In the above example, source/drain regions are formed by driving dopants from the dopant source layers in the active region, but the present disclosure is not limited thereto. For example, the source/drain regions may be formed by ion implantation, plasma doping, etc.

Figure 12:
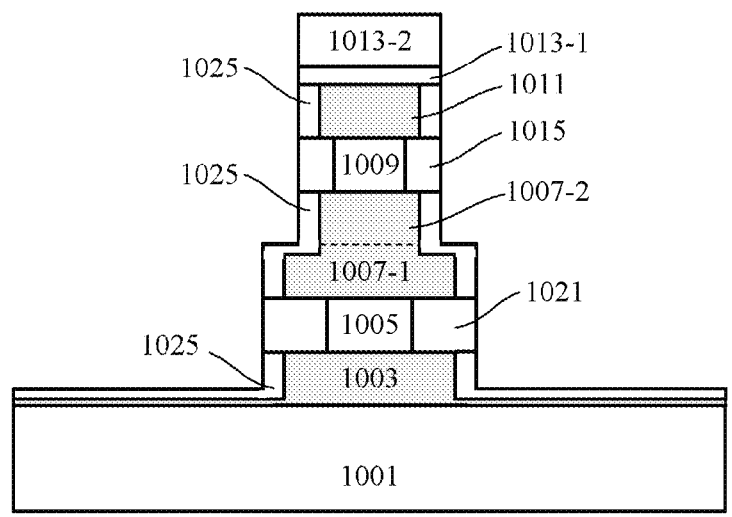

Alternatively, in order to reduce contact resistance, a silicide 1025 may be formed at a surface of the source/drain region, as shown in FIG. 12. For example, a metal layer (for example, Ni, NiPt or Co) may be deposited on the structure shown in FIG. 11 and annealed, so that the metal layer undergoes a silicidation reaction with the semiconductor material to form the silicide 1025. In this example, the silicide 1025 is further formed on a horizontal surface of the lower portion (a portion that is not etched) of the first source/drain layer 1003. Subsequently, the remaining metal, which is unreacted, may be removed.

An isolation layer may be formed around the active region for electrical isolation. Here, in order to adapt to the formation of the gate stack and the electrical contact layer described below, the isolation layer is formed in multiple layers.

Figure 13:
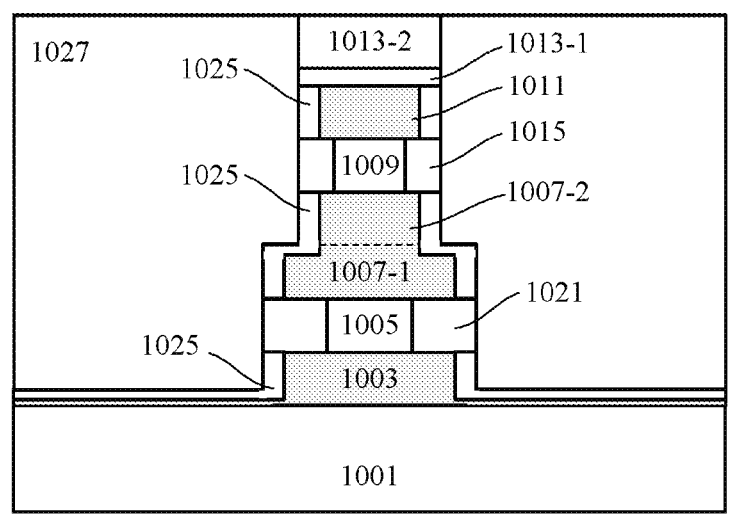
Figure 14:
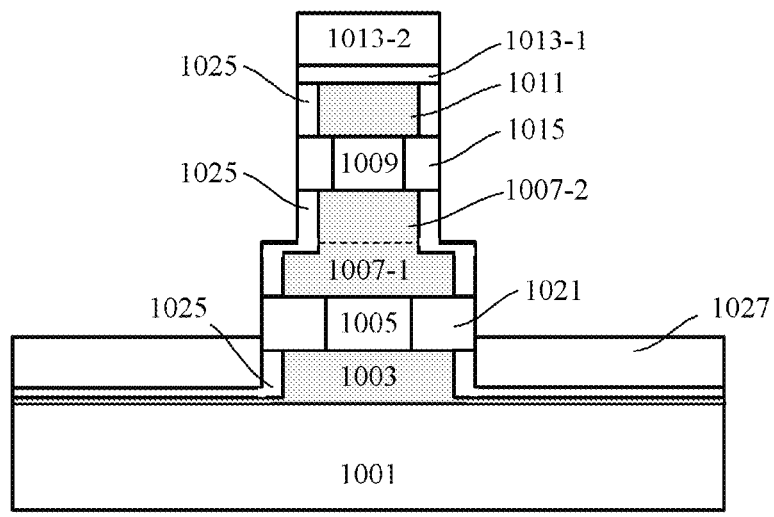

For example, as shown in FIG. 13, an oxide 1027 may be deposited on the structure shown in FIG. 12 and planarized, such as by chemical mechanical polishing (CMP). The CMP may stop at the second hard mask layer 1013-2 (nitride). Then, as shown in FIG. 14, the planarized oxide may be etched back to form the first isolation layer 1027. Here, a top surface of the isolation layer 1027 may be located between a top surface and a bottom surface of the first channel layer 1005, which helps to form a self-aligned gate stack. Due to the presence of the sacrificial gates 1015 and 1021, a material of the isolation layer 1027 may be prevented from entering into the above recess for accommodating gate stacks.

Figure 15:
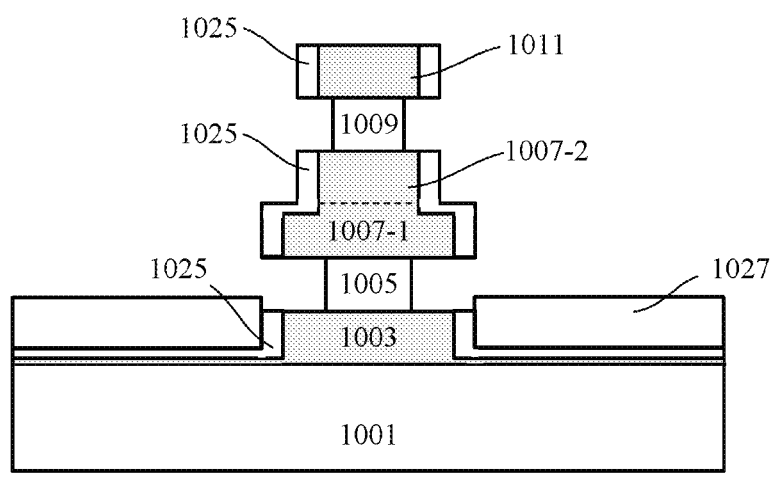

Afterwards, as shown in FIG. 15, the sacrificial gate 1021 may be removed to release a space in the recess of the first channel layer 1005. For example, the sacrificial gate 1021 (nitride) may be removed by a selective etching. In this example, since the sacrificial gate 1015 and the second hard mask layer 1013-2 are also nitrides, they are also removed. In addition, after removing the sacrificial gates 1021 and 1015, cleaning may further be performed to clean surfaces of the channel layers 1005 and 1009 (for example, to remove oxide layers that may exist on the surfaces). During the cleaning process, the first hard mask layer 1013-1 may also be removed.

Figure 16:
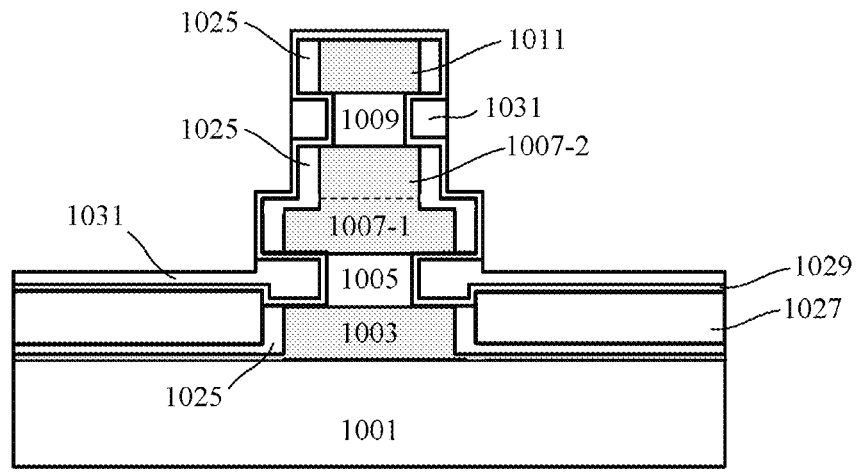

Next, as shown in FIG. 16, a gate stack may be formed in the recess of the first channel layer 1005. Specifically, a first gate dielectric layer 1029 and a first gate conductor layer 1031 may be sequentially deposited on the structure shown in FIG. 15, and the deposited first gate conductor layer 1031 (and optionally the first gate dielectric layer 1029) is etched back such that a top surface of a portion of the layer 1031 outside the recess is not higher, preferably lower, than a top surface of the first channel layer 1005. For example, the first gate dielectric layer 1029 may include a high-K gate dielectric such as $HfO_2$; the first gate conductor layer 1031 may include a metal gate conductor. In addition, a function adjusting layer may also be formed between the first gate dielectric layer 1029 and the first gate conductor layer 1031. Before forming the first gate dielectric layer 1029, an interface layer such as oxide may further be formed.

In this way, the gate stack of the first device may be embedded in and self-aligned to the recess of the first channel layer 1005, so as to overlap an entire height of the first channel layer 1005. In addition, a stack of the first gate dielectric layer 1029 and the first gate conductor layer 1031 is also embedded in a recess of the second channel layer 1009.

Figure 17:
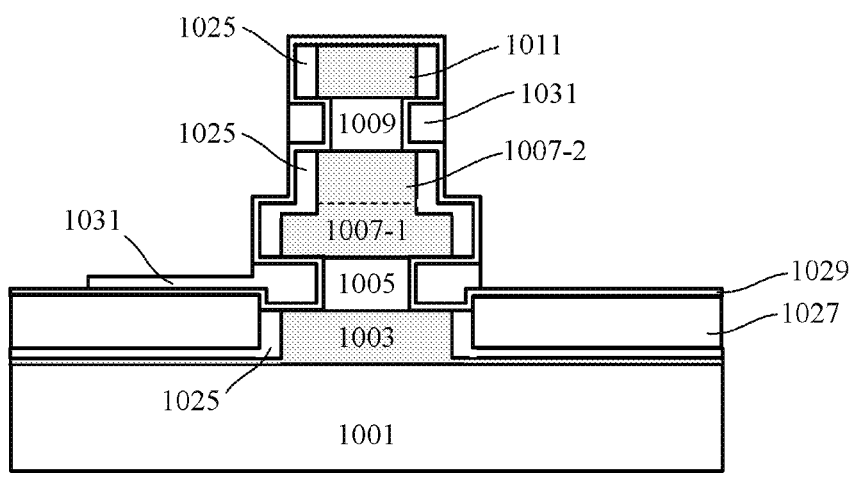

Next, a shape of the gate stack may be adjusted to facilitate a subsequent interconnection production. For example, a photoresist (not shown) may be formed on the structure shown in FIG. 16. The photoresist is patterned, for example, by photolithography to cover a portion (in this example, the left half in the figure) of the gate stack exposed outside the recess, and another portion (in this example, the right half in the figure) of the gate stack exposed outside the recess. Then, the photoresist may be used as a mask to selectively etch, such as RIE, the first gate conductor layer 1031. In this way, in the first gate conductor layer 1031, in addition to a portion left in the recess, a portion blocked by the photoresist is reserved, as shown in FIG. 17. Subsequently, an electrical connection to the gate stack may be formed through the portion.

According to another embodiment, the first gate dielectric layer 1029 may be further selectively etched such as RIE (not shown in the figure). Afterwards, the photoresist may be removed.

Figure 18:
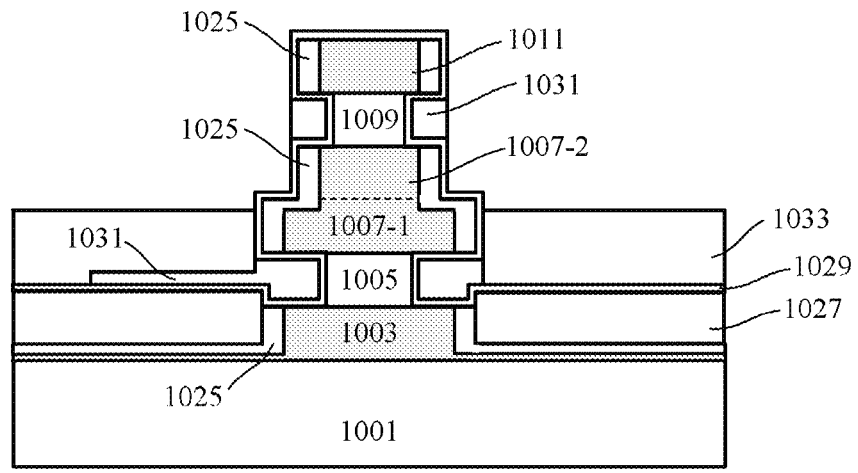

Then, as shown in FIG. 18, an oxide may be deposited on the structure shown in FIG. 17 and etched back to form a second isolation layer 1033. Before the etching back, the deposited oxide may be planarized, such as CMP. Here, a top surface of the isolation layer 1033 may be located between a top surface and a bottom surface of the second source/drain layer 1007 (preferably, between a top surface and a bottom surface of the lower portion 1007-1 of the second source/drain layer), which helps to form electrical contact layers adjacent to the source/drain region S/D-b1 of the first device and the source/drain region S/D-t2 of the second device.

Figure 19:
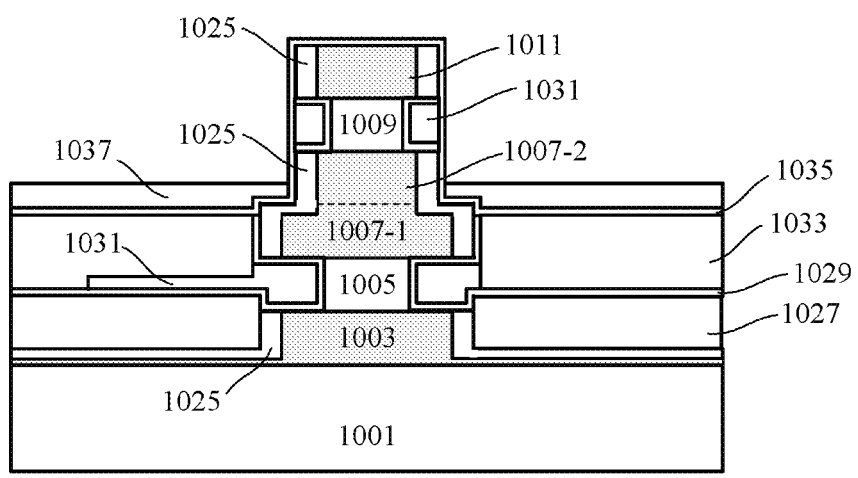

Next, as shown in FIG. 19, an electrical contact layer 1037 may be formed on the structure shown in FIG. 18 by depositing a conductive material and etching it back. For example, the electrical contact layer 1037 may include a metal such as W. A top surface of the electrical contact layer 1037 may be lower than the top surface of the second source/drain layer 1007 (preferably, not lower than a bottom surface of the upper portion 1007-2 of the second source/drain layer). Preferably, before depositing the conductive material, a high-K gate dielectric layer 1029 that is exposed outside may be removed, and also, a barrier layer 1035 such as TiN may be deposited first.

Figure 20:
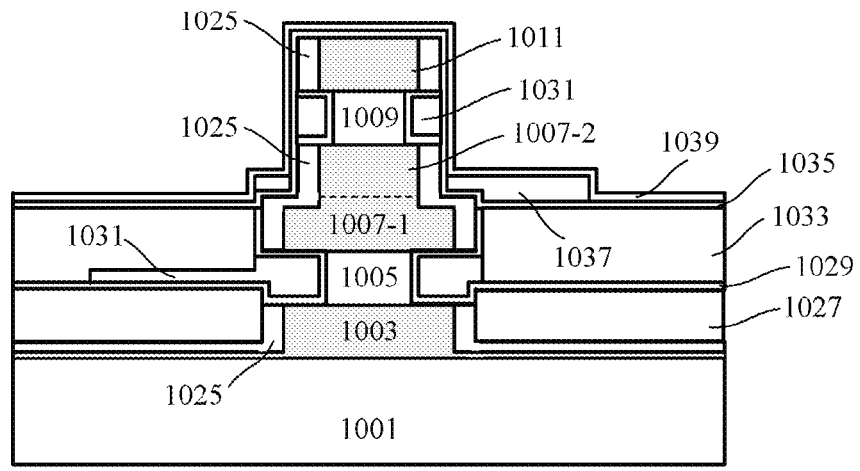

Next, a shape of the electrical contact layer 1037 may be adjusted to facilitate a subsequent interconnection production. For example, as shown in FIG. 20, photolithography may be used to pattern the electrical contact layer 1037 such that a portion of the electrical contact layer 1037 (in this example, a right part of the figure) protrudes laterally with respect to a remaining portion. Subsequently, an electrical connection to the electrical contact layer 1037 may be formed through the protruding portion. Preferably, the electrical contact layer 1037 surrounds the second source/drain layer 1007, which helps to reduce contact resistance.

Similarly, a barrier layer 1039 such as TiN may be further deposited. In this way, barrier layers 1035 and 1039 may encapsulate the electrical contact layer 1037 to prevent its diffusion.

Figure 21:
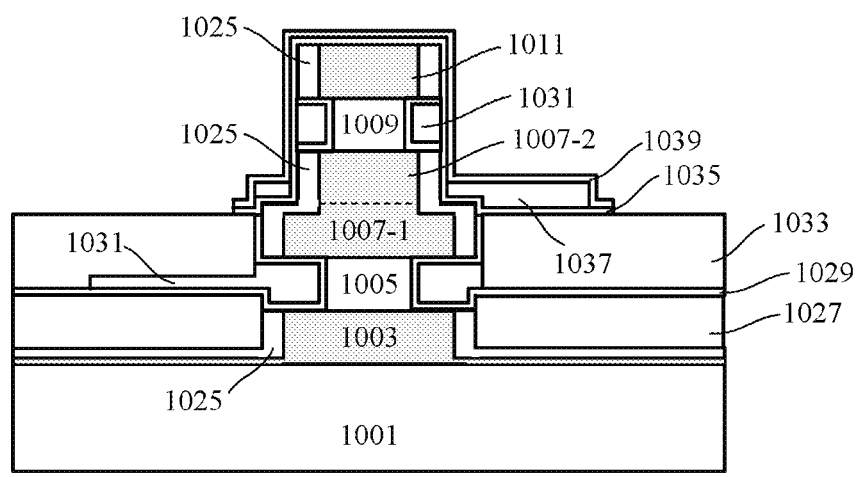
Figure 22:
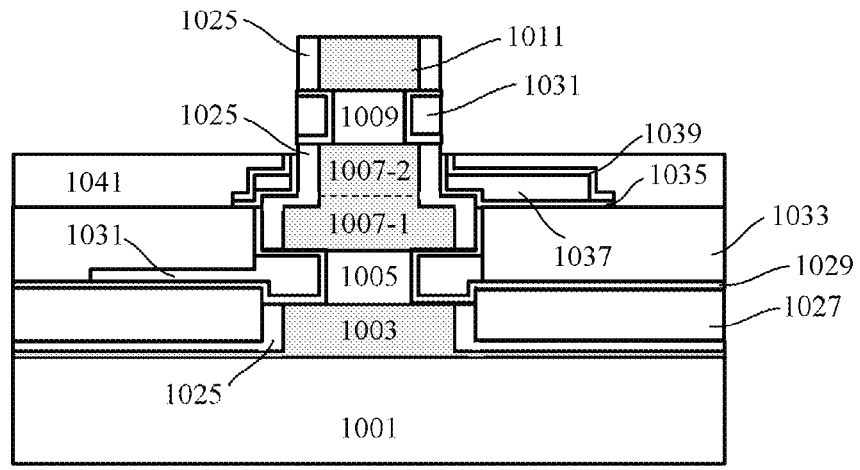

In addition, for the barrier layers 1035, 1039, excess portions in addition to a portion for encapsulating the electrical contact layer 1037, may be removed to prevent it from affecting device performance (for example, the presence of conductive barrier layers in the isolation layer may cause incorrect electrical connection, parasitic capacitance, etc.). For example, this may be done as follows. As shown in FIG. 21, for example, photolithography may be used to remove a portion of laterally extending portions of the barrier layers 1035, 1039 on the second isolation layer 1031. Then, as shown in FIG. 22, a third isolation layer 1041 may be formed on the structure shown in FIG. 21 by, for example, depositing an oxide and etching it back. A top surface of the third isolation layer 1041 may be higher than a top surface of the electrical contact layer 1037, but lower than a bottom surface of the second channel layer 1009. Afterwards, the barrier layers 1035, 1039 exposed by the third isolation layer 1041 may be removed. In this way, the barrier layers 1035 and 1039 substantially only extend on an outer periphery of the electrical contact layer 1037 (with a slight excess to ensure a margin) so as to encapsulate the electrical contact layer 1037.

In this example, for the first device and the second device, a common electrical contact layer 1037 is formed. Certainly, the present disclosure is not limited thereto. Separate electrical contact layers may be formed for the first and the second devices, for example, when opposite source/drain layers in the first device and the second device are not electrically connected.

Figure 23:
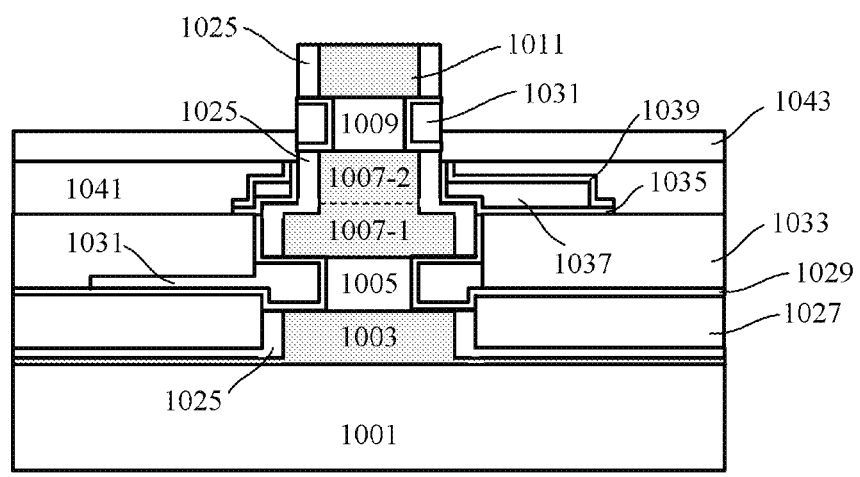

Next, a gate stack of the second device may be similarly formed. For example, as shown in FIG. 23, an oxide may be deposited on the structure shown in FIG. 22 and etched back to form a fourth isolation layer 1043. Before the etching back, the deposited oxide may be planarized, such as CMP. The CMP may stop at the third source/drain layer 1011 or the silicide 1025. Here, a top surface of the isolation layer 1043 may be located between a top surface and a bottom surface of the second channel layer 1009, which helps to form a self-aligned gate stack. Due to the presence of the first gate dielectric layer 1029 and the first gate conductor layer 1031, a material of the isolation layer 1043 may be prevented from entering into the above recess used for accommodating gate stacks.

Figure 24:
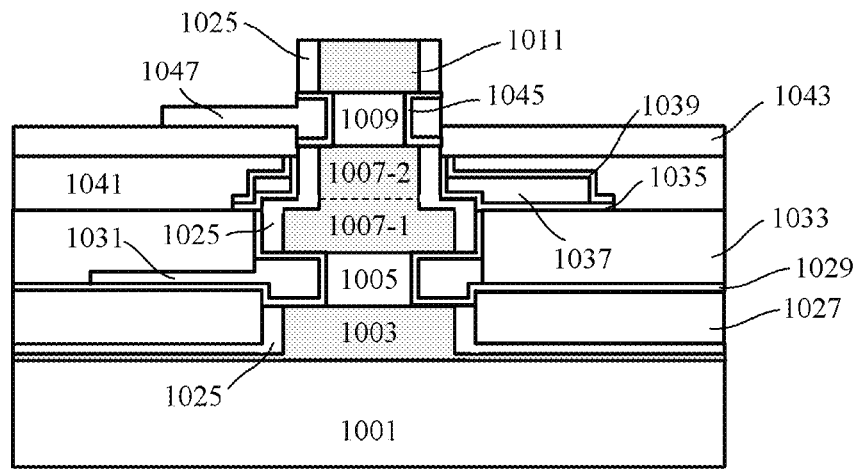

Afterwards, as shown in FIG. 24, the first gate dielectric layer 1029 and the first gate conductor layer 1031 may be removed to release a space in the recess of the second channel layer 1009, and a gate stack, including a second gate dielectric layer 1045 and a second gate conductor layer 1047, of the second device is formed in the space. Similarly, a shape of the gate stack may be adjusted to facilitate subsequent interconnection production. Regarding materials of the first gate dielectric layer and the second gate conductor layer and a formation process thereof, please refer to the above description in conjunction with FIGS. 14-17. It should be pointed out here that the second gate dielectric layer 1045 and the first gate dielectric layer 1029 may be the same or different with each other. When the second gate dielectric layer 1045 is the same as the first gate dielectric layer 1029, in FIG. 24, the first gate dielectric layer 1029 may be reserved and the first gate conductor layer 103 may be removed, and a second gate conductor layer 1047 may be formed in the released recess space. The second gate conductor layer 1047 and the first gate conductor layer 1031 may be the same or different with each other.

In this way, the gate stack of the second semiconductor device may be embedded in and self-aligned to the recess, so as to overlap an entire height of the second channel layer 1009.

Figure 25:
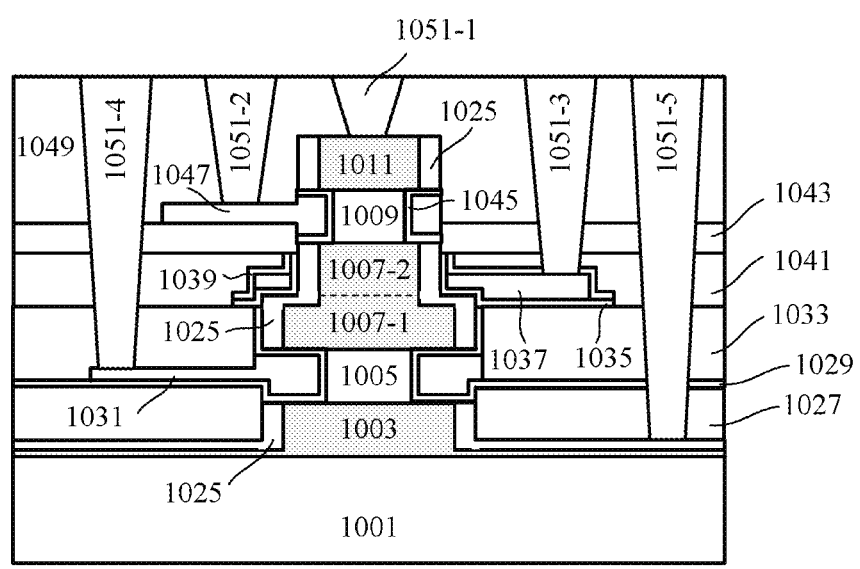

Then, as shown in FIG. 25, an interlayer dielectric layer 1049 may be formed on the structure shown in FIG. 24. For example, an oxide may be deposited and planarized, such as CMP, to form the interlayer dielectric layer 1049. In the interlayer dielectric layer 1049, electrical contacts 1051-1 to 1051-5 to the respective source/drain regions of the first device and the second device and the gate conductor layers may be formed. The contacts may be formed by etching holes in the interlayer dielectric layer 1049 and the isolation layer, and filling the holes with conductive materials such as a metal.

Since the gate conductor layers 1031, 1047 and the electrical contact layer 1037 extend beyond an outer periphery of the active region, corresponding electrical contacts 1051-2 to 1051-4 may be easily formed. In addition, since a doped region in the substrate 1001 extends beyond the active region, a corresponding electrical contact 1051-5 may be easily formed.

FIGS. 26 to 35 show schematic diagrams of some stages in a process of manufacturing a semiconductor device according to another embodiment of the present disclosure.

For example, it may be carried out according to the process described in the above embodiments in conjunction with FIGS. 1 to 11, and will not be repeated here. It should be noted that, in this embodiment, the second hard mask layer 1013-2 may include materials, such as SiC, that may be reserved and not be etched away in the subsequent process, such an arrangement allows the hard mask layers 1013 (especially the second hard mask layer 1013-2 and the first hard mask layer 1013-1 below it) to be reserved in the entire processing.

Figure 26:
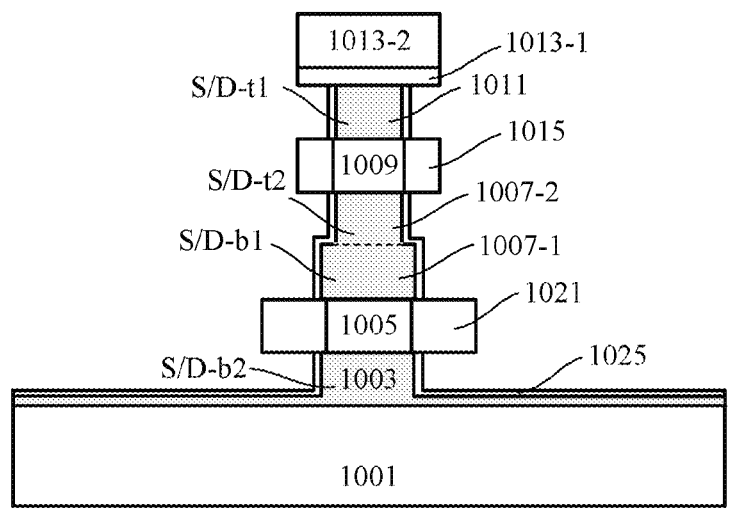
FIGS. 26-35 show schematic diagrams of some stages in a process of manufacturing a semiconductor device according to another embodiment of the present disclosure.

As shown in FIG. 26, the third source/drain layer 1011 of the second device and the upper portion 1007-2 of the second source/drain layer are thinned on the structure shown in FIG. 11, so that lateral sizes of the third source/drain layer 1011 and the upper portion 1007-2 of the second source/drain layer are reduced (may be even smaller than the size of the second channel layer 1009), and outer peripheries of the thinned third source/drain layer 1011 and upper portion 1007-2 of the second source/drain layer may be substantially aligned with each other. Similarly, the lower portion 1007-1 of the second source/drain layer 1007 and the upper portion of the first source/drain layer 1003 of the first device are thinned, so that lateral sizes of the lower portion 1007-1 of the second source/drain layer 1007 and the upper portion of the first source/drain layer 1003 are reduced (may be even smaller than the size of the first channel layer 1005), and outer peripheries of the thinned lower portion 1007-1 of the second source/drain layer and first source/drain layer 1003 may be substantially aligned with each other. Thinning of the source/drain layer of the first device and thinning of the source/drain layer of the second device may be performed simultaneously. The thinning may effectively reduce a facing area between the gate and the source/drain, thereby reducing an overlapping capacitance between the gate and the source/drain and improving reliability of the semiconductor device. Alternatively, in order to reduce the contact resistance, the thinned source/drain layer may be silicidated, so that a silicide 1025 may be formed on a surface of the source/drain layer. The silicidation process has been described above in conjunction with FIG. 12, and will not be repeated here.

An isolation layer may be formed around the active region for electrical isolation. Here, in order to adapt to the formation of the gate stack and the electrical contact layer described below, the isolation layer is formed in multiple layers.

Figure 27:
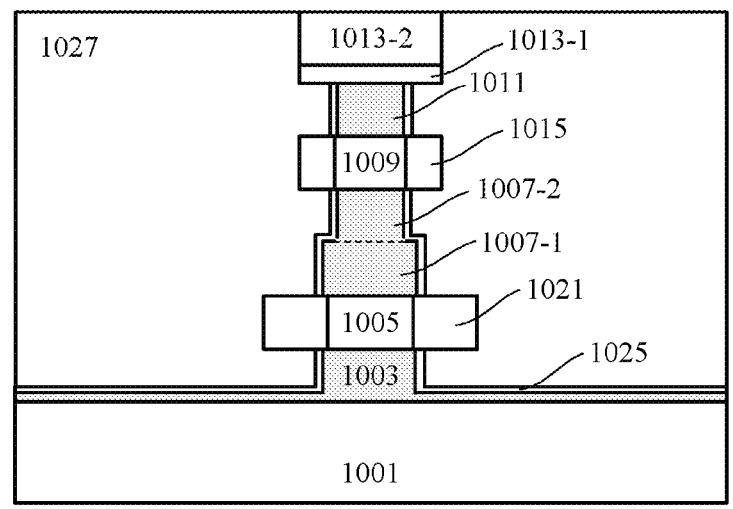
Figure 28:
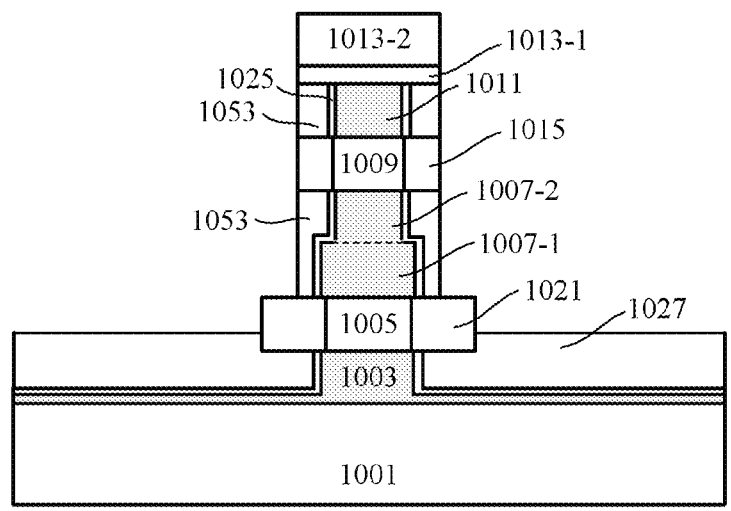

For example, as shown in FIG. 27, an oxide 1027 may be deposited on the structure shown in FIG. 26, and planarized and stopped at the second hard mask layer 1013-2 (SiC). Then, as shown in FIG. 28, the planarized oxide may be etched back to form a first isolation layer 1027. Here, a top surface of the isolation layer 1027 may be located between a top surface and a bottom surface of the first channel layer 1005, which helps to form a self-aligned gate stack. Due to the presence of sacrificial gates 1015 and 1021, a material of the isolation layer 1027 may be prevented from entering into the above recesses used for accommodating gate stacks. In addition, during the process of etching back an oxide, the oxide in recesses of the sidewalls of the second source/drain layer 1007 and the third source/drain layer 1011 with respect to an outer periphery of the hard mask layer is reserved, thereby forming a shielding layer 1053. The shielding layer 1053 is substantially coplanar with a corresponding source/ drain layer, which helps to subsequently form a gate stack self-aligned to the channel layer.

Figure 29:
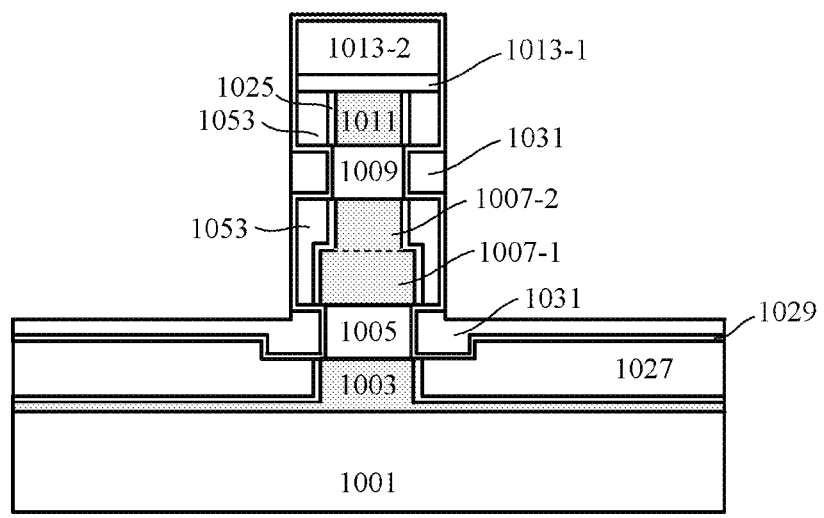

Afterwards, as shown in FIG. 29, the sacrificial gate 1021 may be removed to release a space in the recess of the first channel layer 1005 with respect to the shielding layer 1053. The sacrificial gate 1015 is also removed. Then, a gate stack may be formed in a recess of the first channel layer 1005. Specifically, the first gate dielectric layer 1029 and the first gate conductor layer 1031 may be sequentially deposited and the deposited first gate conductor layer 1031 is etched back, such that a top surface of the portion outside the recess is not higher, preferably lower, than a top surface of the first channel layer 1005. In this regard, please refer to above description in conjunction with FIGS. 15 and 16, details thereof are not repeated here.

In this way, the gate stack of the first device may be embedded in the recess of the first channel layer 1005 with respect to the shielding layer 1053, and self-aligned to the first channel layer 1005, so as to overlap an entire height of the first channel layer 1005. In addition, a stack of the first gate dielectric layer 1029 and the first gate conductor layer 1031 is also embedded in a recess of the second channel layer 1009 with respect to the shielding layer 1053.

Figure 30:
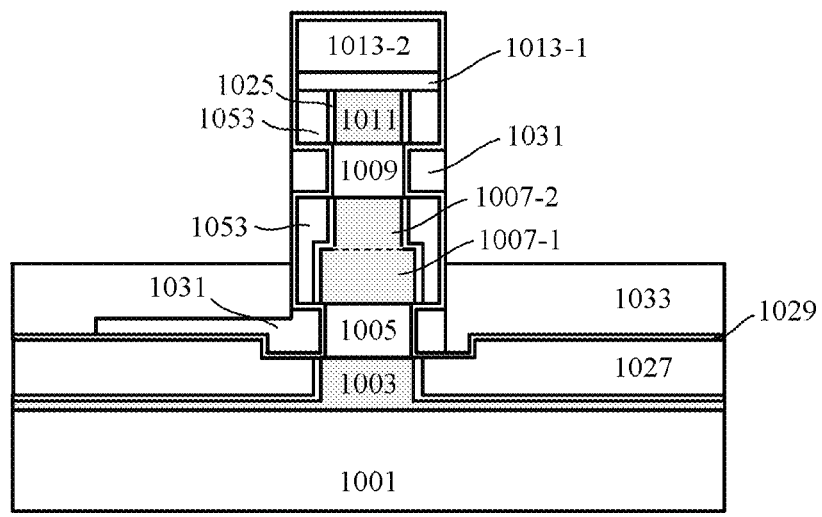

Next, a shape of the gate stack may be adjusted to facilitate subsequent interconnection production. For example, a photoresist (not shown) may be formed on the structure shown in FIG. 29. For example, the photoresist is patterned, for example, by photolithography to cover a portion (in this example, the left half of the figure) of the gate stack exposed outside the recess, and another portion (in this example, the right half of the figure) of the gate stack exposed outside the recess. Then, the photoresist may be used as a mask to selectively etch, such as RIE, the first gate conductor layer 1031. In this way, for the first gate conductor layer 1031, a portion blocked by the photoresist in addition to a portion left in the recess, is reserved, as shown in FIG. 30, and then the photoresist may be removed. Subsequently, an electrical connection to the gate stack may be formed through the portion.

Continued in FIG. 30, an oxide is deposited and etched back to form a second isolation layer 1033. Before the etching back, the deposited oxide may be planarized. Here, a top surface of the isolation layer 1033 may be located between a top surface and a bottom surface of the second source/drain layer 1007, which helps to form electrical contact layers adjacent to the source/drain region S/D-b1 of the first device and the source/drain region S/D-t2 of the second device.

Figure 31:
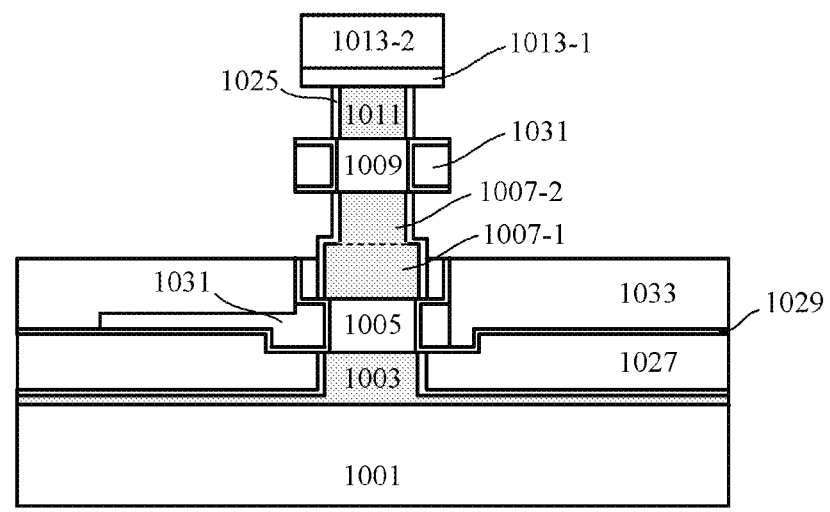
Figure 32:
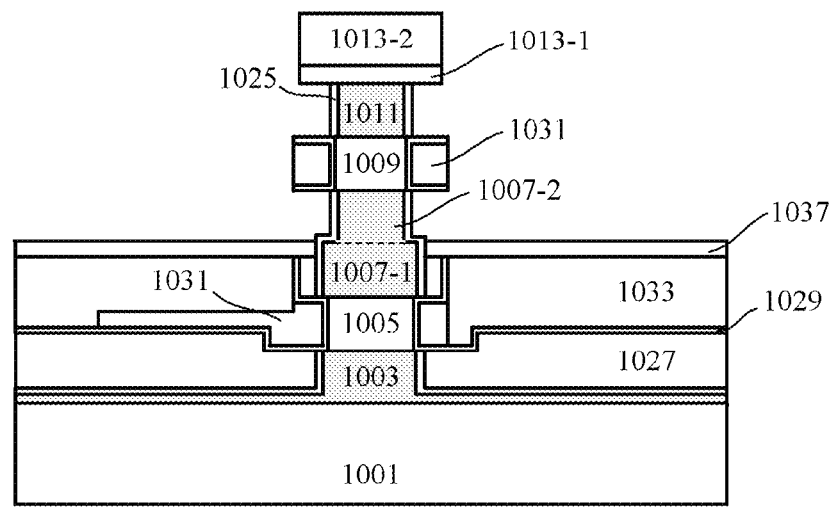

Next, as shown in FIG. 31, a high-K gate dielectric layer 1029 exposed outside may be removed, and the shielding layer 1053 may be at least partially removed to at least partially expose the second source/drain layer 1007 and the third source/drain layer 1011. In this structure, as shown in FIG. 32, an electrical contact layer 1037 may be formed by depositing a conductive material and etching it back. For example, the electrical contact layer 1037 may include a metal such as W. A top surface of the electrical contact layer 1037 may be lower than a top surface of the second source/drain layer 1007. Preferably, before depositing the conductive material, a barrier layer (not shown in the figure) may be deposited first. In this regard, please refer to above description in conjunction with FIGS. 18 and 19, and details thereof are not repeated here.

Figure 33:
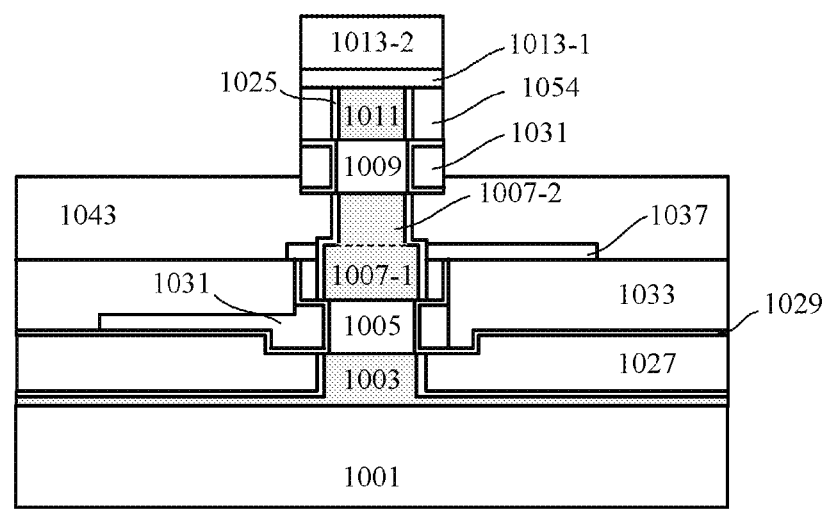

Next, a shape of the electrical contact layer 1037 may be adjusted to facilitate subsequent interconnection production. For example, as shown in FIG. 33, photolithography may be used to pattern the electrical contact layer 1037 such that a portion of the electrical contact layer 1037 (in this example, a right part of the figure) protrudes laterally with respect to a remaining portion. Subsequently, an electrical connection to the electrical contact layer 1037 may be formed through the protruding portion. Preferably, the electrical contact layer 1037 surrounds the second source/drain layer 1007, which helps to reduce the contact resistance.

Similarly, a barrier layer (not shown in the figure) may be further deposited. In this way, the barrier layer deposited at this time and the barrier layer deposited previously may encapsulate the electrical contact layer 1037 to prevent its diffusion. In addition, a third isolation layer (not shown in the figure) may also be formed, and a barrier layer exposed by the third isolation layer is removed by photolithography, so that the barrier layer substantially only extends on an outer periphery of the electrical contact layer 1037 (with a slight excess to ensure a margin) so as to encapsulate the electrical contact layer 1037. In this regard, please refer to above description in conjunction with FIGS. 20 and 22, and details thereof are not repeated here.

Continued in FIG. 33, a gate stack of the second device may be similarly formed. For example, an oxide is continuously deposited and etched back to form a fourth isolation layer 1043. Before the etching back, the deposited oxide may be planarized, such as CMP, so that a top surface of the isolation layer 1043 may be located between a top surface and a bottom surface of the second channel layer 1009, which helps to form a self-aligned gate stack, and the isolation layer 1043 fills a recess of the third source/drain layer 1011 with respect to the hard mask layer to form another shielding layer 1054. The shielding layer 1054 is substantially coplanar with a corresponding source/drain layer, which helps to subsequently form a gate stack self-aligned to the channel layer.

Figure 34:
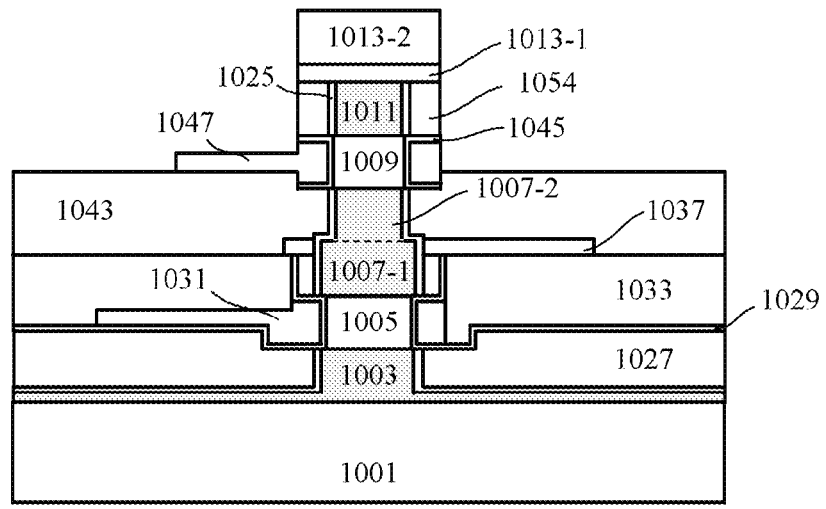

Afterwards, as shown in FIG. 34, the first gate dielectric layer 1029 and the first gate conductor layer 1031 may be removed to release a space of the recess of the second channel layer 1009 with respect to the shielding layer 1054, and a gate stack, including a second gate dielectric layer 1045 and a second gate conductor layer 1047, of the second device is formed in the space. The gate conductor layer 1047 is etched back so that a top surface of a portion of the gate conductor layer 1047 outside the recess is lower than a top surface of the second channel layer 1009. Similarly, a shape of the gate stack may be adjusted to facilitate the subsequent interconnection production. It should be pointed out here that the second gate dielectric layer 1045 and the first gate dielectric layer 1029 may be the same or different with each other. When the second gate dielectric layer 1045 is the same as the first gate dielectric layer 1029, in FIG. 34, the first gate dielectric layer 1029 may be reserved and the first gate conductor layer 1031 may be removed, and a second gate conductor layer 1047 may be formed in the released recessed space. The second gate conductor layer 1047 and the first gate conductor layer 1031 may be the same or different with each other.

In this way, the gate stack of the second device may be embedded in the recess of the second channel layer 1009 with respect to the shielding layer 1054, and self-aligned to the second channel layer 1009, so as to overlap an entire height of the second channel layer 1009.

Figure 35:
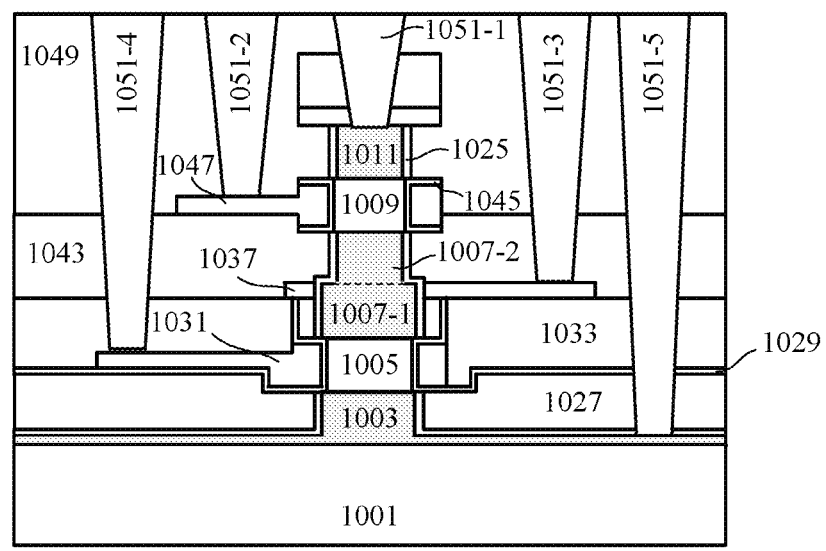

Then, as shown in FIG. 35, an interlayer dielectric layer 1049 may be formed on the structure shown in FIG. 34. For example, an oxide may be deposited and planarized, such as CMP, to form the interlayer dielectric layer 1049. In the interlayer dielectric layer 1049, electrical contacts 1051-1 to 1051-5 to the respective source/drain regions of the first device and the second device and the gate conductor layers may be formed. The contacts may be formed by etching holes in the interlayer dielectric layer 1049 and the isolation layer, and filling the holes with conductive materials such as a metal. Since the gate conductor layers 1031, 1047 and the electrical contact layer 1037 extend beyond an outer periphery of the active region, corresponding electrical contacts 1051-2 to 1051-4 may be easily formed. In addition, since a doped region in the substrate 1001 extends beyond the active region, a corresponding electrical contact 1051-5 may be easily formed.

According to the above embodiment, as shown in FIGS. 25 and 35, the semiconductor device may include a first device and a second device that are stacked in a vertical direction. The first device includes a first source/drain layer 1003, a first channel layer 1005, and a second source/drain layer 1007 (or a lower portion 1007-1 thereof) that are stacked in the vertical direction. At least a part of the sidewall of the first channel layer 1005 extends along a first crystal plane or crystal plane family, and a gate stack (1029/1031) is formed around an outer periphery of the first channel layer 1005. Similarly, the second device includes a second source/drain layer 1007 (or an upper portion 1007-2 thereof), a second channel layer 1009, and a third source/drain layer 1011 that are stacked in the vertical direction. At least a part of the sidewall of the second channel layer 1009 extends along a second crystal plane or crystal plane family, and a gate stack (1045/1047) is formed around an outer periphery of the first channel layer 1005.

In the above embodiments, in the process of defining the active region of the semiconductor device, the photoresist is used for patterning. However, the present disclosure is not limited thereto, for example, a pattern transfer technology and the like may also be used.

FIGS. 36-39 show schematic diagrams of a process of patterning a hard mask layer according to an embodiment of the present disclosure.

In this embodiment, a stack of the semiconductor shown in FIG. 1 is still used. As shown in FIG. 1, a hard mask layer 1013 may also be formed on the semiconductor layers. The hard mask layer 1013 may include a first hard mask layer 1013-1, a second hard mask layer 1013 and the third hard mask layer 1013-3 that are sequentially stacked. In another embodiment, the hard mask 1013 may also be arranged in other manners.

Figure 36:
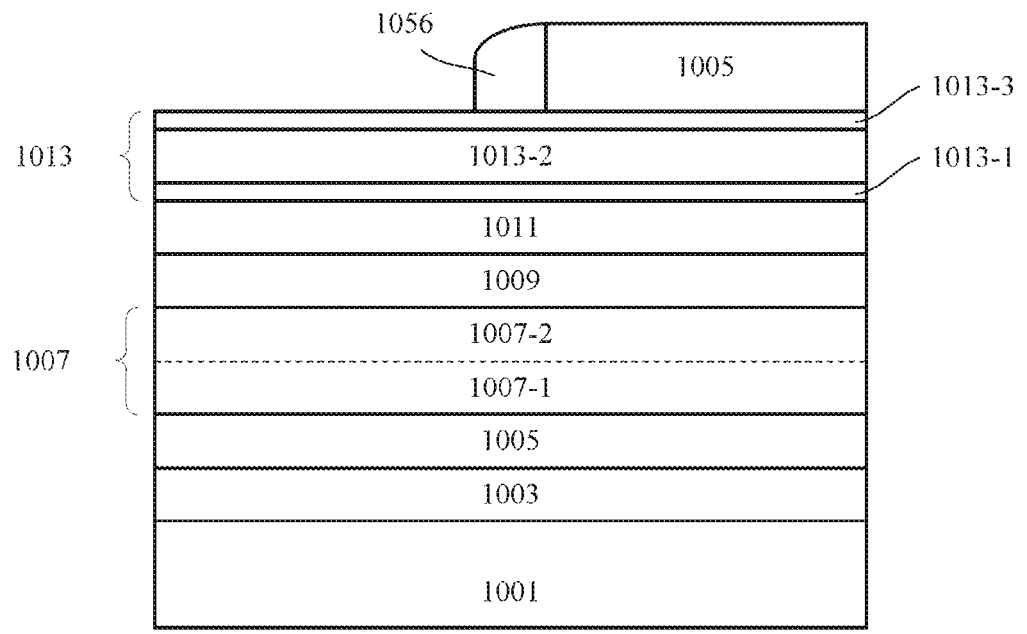
FIGS. 36-39 show schematic diagrams of a process of patterning a hard mask layer according to an embodiment of the present disclosure.
Figure 37A:
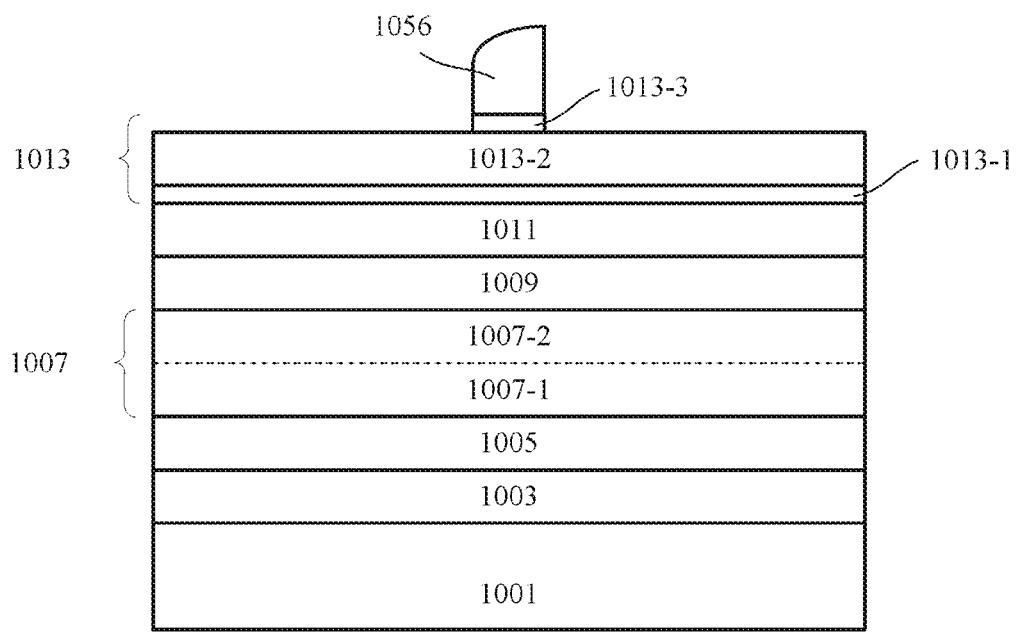
Figure 37B:
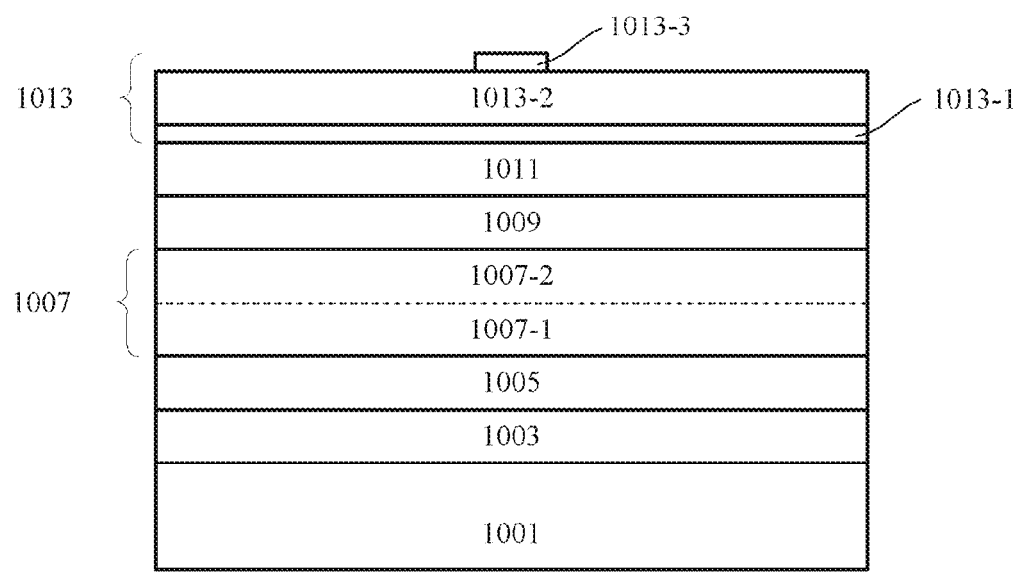
Figure 37C:
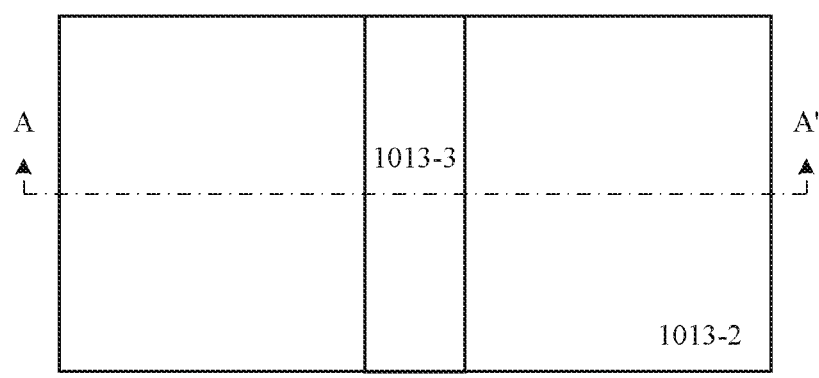

As shown in FIG. 36, a first sacrificial layer 1055 is formed on the hard mask layer 1013. Considering etching selectivity, for example, the first sacrificial layer 1055 may include an amorphous silicon (α-Si). The first sacrificial layer 1055 includes a first sidewall (a sidewall on the left side shown in the figure) extending in a first direction. Here, the first direction extends along a direction of a crystal plane or a crystal plane family, such as, a (100) crystal plane or a {100} crystal plane family. Through a spacer forming process, a first spacer 1056 extending in the first direction may be formed on the first sidewall of the first sacrificial layer 1055. Considering the etching selectivity, for example, the first spacer 1056 may include nitride. After forming the first spacer 1056, the first sacrificial layer 1055 may be removed. Then, a pattern of the first spacer 1056 may be transferred to the hard mask layer 1013, and the first spacer may be removed. Specifically, as shown in FIGS. 37(*a*)-37(*c*) (wherein FIG. 37(*a*) is a front cross-sectional view before the first spacer 1056 is removed, FIG. 37(*b*) is a front cross-sectional view after the first spacer 1056 is removed, FIG. 37(*c*) is a top view, where line AA' shows an interception position of the cross section), firstly, the pattern of the first spacer 1056 may be transferred to the third hard mask layer 1013-3 of the hard mask layer 1013. For example, this may be performed by selectively etching the third hard mask layer 1013-3 such as RIE. The RIE may stop at the second hard mask layer 1013-2. Subsequently, the first spacer 1056 may be removed by a selective etching (optionally, 1056 may be reserved). As shown in FIG. 37(*c*), the third hard mask layer 1013-3 has a strip shape extending in the first direction.

Figure 38:
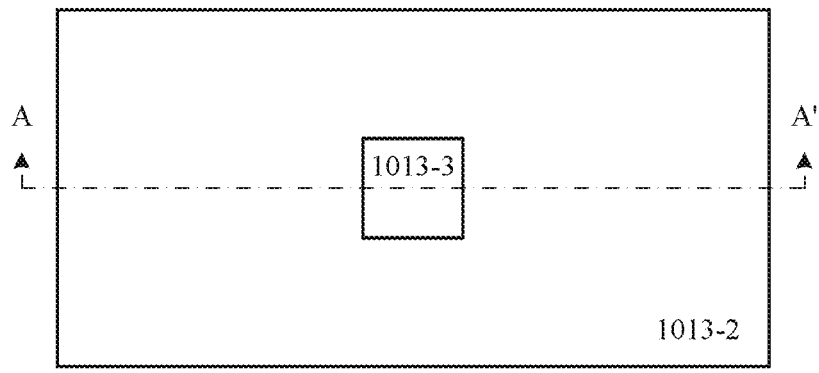

Further, a second sacrificial layer is formed on the hard mask layer 1013, and the second sacrificial layer includes a second sidewall extending in a second direction. Here, the second direction may also extend along a direction of a crystal plane or a crystal plane family, such as a (100) crystal plane or a {100} crystal plane family. That is, the second direction may extend along the same direction of the crystal plane family as the first direction does. The second direction may be different from the first direction, such as intersecting with (e.g., perpendicular to) the first direction, so as to subsequently define a closed pattern. A second spacer extending in the second direction may be formed on the second sidewall. A pattern of the second spacer intersects a pattern of the first spacer, so that a desired pattern is defined at a position where the second spacer and the first spacer intersect with each other. The formation of the second sacrificial layer and the second sidewall may be the same as the formation of the first sacrificial layer and the first sidewall, except that their extending directions are different, and the description thereof will not be repeated here. Then, the pattern of the second spacer may be transferred to the third hard mask layer 1013-3 of the hard mask layer 1013, and the second spacer may be removed. Thus, the third hard mask layer 1013-3 is in a rectangular shape in a plan view, as shown in FIG. 38. In this example, the third hard mask layer 1013-3 has a square column shape with its sidewall extending along a (100) crystal plane. The third hard mask layer 1013-3 may be used as a mask to define an active region of an n-type device.

Figure 39:
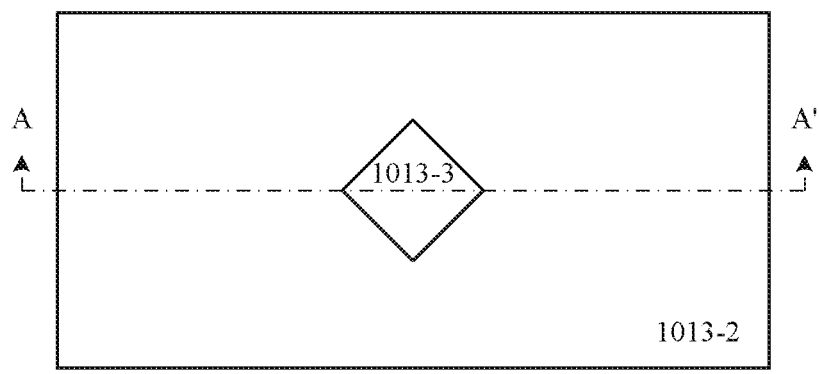

Similarly, when an active region of a p-type device is defined, two spacers, extending along a direction of a (110) crystal plane or a {110} crystal plane family and intersecting with (e.g., perpendicular to) each other, may also be formed respectively, and a pattern of the active region is defined by the two spacers. Thus, the third hard mask layer 1013-3 may be patterned into a square column with its sidewall extending along a (110) crystal plane or a {110} crystal plane family, a top view of which is shown in FIG. 39.

Through the pattern transfer technology, it is possible to at least partially overcome the limitation of photolithography technology, and make a pattern size more precise.

In this example, it is illustrated that two devices are stacked on top of each other. However, the present disclosure is not limited thereto, and there may be more devices stacked on top of each other in a vertical direction.

The semiconductor configuration according to the embodiment of the present disclosure may be applied to various electronic devices. For example, by integrating a plurality of the semiconductor configurations and other devices (for example, other forms of transistors, etc.), it is possible to form an integrated circuit (IC) and thereby construct an electronic device. Therefore, the present disclosure also provides an electronic device including the above semiconductor configuration. The electronic device may also include components such as a display screen adapted to an integrated circuit and a wireless transceiver adapted to an integrated circuit. Such an electronic device includes a smart phone, computer, tablet computer (PC), wearable smart device, mobile power supply, and so on.

According to an embodiment of the present disclosure, a manufacturing method of a system on chip (SoC) is further provided. This method may include the above described method of manufacturing a semiconductor configuration. Specifically, a variety of devices may be integrated on the chip, at least some of which are manufactured according to the method of the present disclosure.

In the above description, technical details such as patterning and etching of each layer have not been described in detail. However, those ordinary skilled in the art should understand that layers, regions, etc. of desired shapes may be formed by using various technical means. In addition, to form the same structure, those ordinary skilled in the art can also design a method that is not completely the same as the method described above. In addition, although the embodiments are described above separately, this does not mean that means in the embodiments cannot be advantageously used in combination with each other.

The embodiments of the present disclosure have been described above. However, these embodiments are used for illustrative purposes only, and are not used to limit the protection scope of the present disclosure. The protection scope of the present disclosure is defined by the claims and equivalent substitutions thereof. Those ordinary skilled in the art may make various substitutions and modifications, and such modifications and modifications should also be regarded as falling within the protection scope of the present disclosure.

The invention claimed is:

1. A semiconductor device, comprising:
a substrate; and
a first device and a second device that are sequentially stacked on the substrate, each of the first device and the second device comprising: a first source/drain layer, a channel layer, and a second source/drain layer that are sequentially stacked from bottom to top, and a gate stack around at least a part of an outer periphery of the channel layer,
wherein sidewalls of the respective channel layers of the first device and the second device extend at least partially along different crystal planes or crystal plane families.

2. The semiconductor device according to claim 1, wherein,
the channel layer of the first device comprises a single crystal semiconductor material; and/or
the channel layer of the second device comprises a single crystal semiconductor material.

3. The semiconductor device according to claim 2, wherein,
the first device is an n-type device, and at least a part of the sidewall of the channel layer of the first device extends along a (100) crystal plane or a {100} crystal plane family, while the second device is a p-type device, and at least a part of the sidewall of the channel layer of the second device extends along a (110) crystal plane or a {110} crystal plane family; or
the first device is a p-type device, and at least a part of the sidewall of the channel layer of the first device extends along a (110) crystal plane or a {110} crystal plane family, while the second device is an n-type device, and at least a part of the sidewall of the channel layer of the second device extends along a (100) crystal plane or a {100} crystal plane family.

4. The semiconductor device according to claim 1, wherein,
the first device is an n-type device, the channel layer of the first device comprises a semiconductor material of one of Si, SiGe, or Ge crystals, and at least a part of the sidewall of the channel layer extends along a (100) crystal plane or a {100} crystal plane family, while the second device is a p-type device, the channel layer of the second device comprises a semiconductor material of one of Si, SiGe, or Ge crystals, and at least a part of the sidewall of the channel layer extends along a (110) crystal plane or a {110} crystal plane family; or
the first device is a p-type device, the channel layer of the first device comprises a semiconductor material of one of Si, SiGe, or Ge crystals, and at least a part of the sidewall of the channel layer extends along a (100) crystal plane or a {110} crystal plane family, while the second device is an n-type device, the channel layer of the second device comprises a semiconductor material of one of Si, SiGe, or Ge crystals, and at least a part of the sidewall of the channel layer extends along a (100) crystal plane or a {100} crystal plane family.

5. The semiconductor device according to claim 4, wherein a direction from the first source/drain layer toward the second source/drain layer of the first device is along a [100] crystal orientation or along a <100> crystal orientation family, and/or a direction from the first source/drain layer toward the second source/drain layer of the second device is along the [100] crystal orientation or along the <100> crystal orientation family.

6. The semiconductor device according to claim 1, wherein,
the channel layer of the first device comprises a single crystal semiconductor material and the channel layer of the second device comprises a single crystal semiconductor material, and the channel layer of the first device has a crystal orientation the same as that of the channel layer of the second device.

7. The semiconductor device according to claim 1, wherein,
the channel layer of the first device comprises a single crystal semiconductor material and the channel layer of the second device comprises a single crystal semiconductor material, and the channel layer of the first device has a crystal structure the same as that of the channel layer of the second device.

8. The semiconductor device according to claim 1, wherein:
a corner formed by adjacent sidewalls of the channel layer of the first device is a rounded corner; and/or
a corner formed by adjacent sidewalls of the channel layer of the second device is a rounded corner.

9. The semiconductor device according to claim 1, wherein:
in a top view, the first source/drain layer, the channel layer and the second source/drain layer of the second device are within a range of the second source/drain layer of the first device.

10. The semiconductor device according to claim 1, wherein the second source/drain layer of the first device and the first source/drain layer of the second device are contiguous to each other.

11. The semiconductor device according to claim 10, wherein the second source/drain layer of the first device is integral with the first source/drain layer of the second device.

12. The semiconductor device according to claim 11, wherein:
the first source/drain layer of the first device is a semiconductor layer epitaxially grown on the substrate, and the channel layer of the first device is a semiconductor layer epitaxially grown on the first source/drain layer of the first device;
both the second source/drain layer of the first device and the first source/drain layer of the second device are semiconductor layers grown epitaxially on the channel layer of the first device;
the channel layer of the second device is a semiconductor layer epitaxially grown on the first source/drain layer of the second device, and the second source/drain layer of the second device is a semiconductor layer epitaxially grown on the channel layer of the second device.

13. The semiconductor device of claim 10, further comprising:
an electrical contact layer electrically connected to both the second source/drain layer of the first device and the first source/drain layer of the second device.

14. The semiconductor device according to claim 13, wherein the electrical contact layer surrounds an outer periphery of the second source/drain layer of the first device and an outer periphery of the first source/drain layer of the second device.

15. The semiconductor device according to claim 13, wherein:
the gate stack of the first device comprises a laterally extending portion which extends laterally outward from the sidewall of the channel layer;
the electrical contact layer comprises a laterally extending portion which protrudes laterally with respect to a remaining portion thereof;
the gate stack of the second device comprises a laterally extending portion which extends laterally outward from the sidewall of the channel layer; and
at least some of the laterally extending portion of the gate stack of the first device, the laterally extending portion of the electrical contact layer, and the laterally extending portion of the gate stack of the second device extend laterally in different directions.

16. The semiconductor device according to claim 15, wherein if at least some of the laterally extending portion of the gate stack of the first semiconductor device, the laterally extending portion of the electrical contact layer, and the laterally extending portion of the gate stack of the second semiconductor device overlap vertically, then among those overlapped laterally extending portions, a lower one extends beyond an upper one.

17. The semiconductor device according to claim 1, wherein the gate stack of the first device and the gate stack of the second device have different stack configurations.

18. An electronic device, comprising an integrated circuit formed at least partially by the semiconductor device according to claim 1.

19. The electronic device according to claim 18, further comprising: a display cooperative with the integrated circuit and a wireless transceiver cooperative with the integrated circuit.

20. The electronic device according to claim 18, comprising at least one of a smart phone, a computer, a tablet computer, a wearable device, and/or a mobile power supply.

21. A method of manufacturing a semiconductor device, comprising:
sequentially stacking, from bottom to top, a first source/drain layer, a channel layer and a second source/drain layer of a first device, and a first source/drain layer, a channel layer and a second source/drain layer of a second device on a substrate;
defining active regions of the respective devices in the first source/drain layer, channel layer, and second source/drain layer of the first device, and in the first source/drain layer, channel layer and second source/drain layer of the second semiconductor device, such that a sidewall of the channel layer of the first device and a sidewall of the channel layer of the second device extend at least partially along different crystal planes or crystal plane families; and
forming respective gate stacks of the first device and the second device each around at least a part of outer peripheries of the respective channel layers of the first device and the second device.

22. The method according to claim 21, wherein,
a direction from the first source/drain layer toward the second source/drain layer of the first device is along a [100] crystal orientation or along a <100> crystal orientation family, and/or a direction from the first source/drain layer toward the second source/drain layer of the second device is along a [100] crystal orientation or along a <100> crystal orientation family.

23. The method according to claim 21, wherein,
the channel layer of the first device comprises a single crystal semiconductor material, and/or the channel layer of the second device comprises a single crystal semiconductor material.

24. The method according to claim 23, wherein,
the first device is an n-type device, and at least a part of the sidewall of the channel layer of the first device extends along a (100) crystal plane or a {100} crystal plane family, while the second device is a p-type device, and at least a part of the sidewall of the channel layer of the second device extends along a (110) crystal plane or a {110} crystal plane family; or
the first device is a p-type device, and at least a part of the sidewall of the channel layer of the first device extends along a (110) crystal plane or a {110} crystal plane family, while the second device is an n-type device, and at least a part of the sidewall of the channel layer of the second device extends along a (100) crystal plane or a {100} crystal plane family.

25. The method according to claim 21, wherein,
the first device is an n-type device, the channel layer of the first device comprises a semiconductor material of one of Si, SiGe, or Ge crystals, and at least a part of the sidewall of the channel layer extends along a (100) crystal plane or a {100} crystal plane family, while the second device is a p-type device, the channel layer of the second device comprises a semiconductor material of one of Si, SiGe, or Ge crystals, and at least a part of the sidewall of the channel layer extends along a (110) crystal plane or a {110} crystal plane family; or
the first device is a p-type device, the channel layer of the first device comprises a semiconductor material of one of Si, SiGe, or Ge crystals, and at least a part of the sidewall of the channel layer extends along a (100) crystal plane or a {110} crystal plane family, while the second device is an n-type device, the channel layer of the second device comprises a semiconductor material of one of Si, SiGe, or Ge crystals, and at least a part of the sidewall of the channel layer extends along a (100) crystal plane or a {100} crystal plane family.

26. The method according to claim 21, wherein the channel layer of the first device comprises a single crystal semiconductor material and the channel layer of the second device comprises a single crystal semiconductor material, and the channel layer of the first device has a crystal orientation the same as that of the channel layer of the second device.

27. The method according to claim 21, wherein,
the channel layer of the first device comprises a single crystal semiconductor material and the channel layer of the second device comprises a single crystal semiconductor material, and the channel layer of the first device has a crystal structure the same as that of the channel layer of the second device.

28. The method according to claim 21, wherein the defining of the active regions of the semiconductor devices comprises:
sequentially selectively etching the second source/drain layer, the channel layer and the first source/drain layer of the second device to form a pattern with sidewall extending along a first crystal plane or crystal plane family, and recessing the outer periphery of the channel layer with respect to outer peripheries of the first and second source/drain layers by isotropic etching;
forming a sacrificial gate of the second device in a recess of the channel layer with respect to the first and second source/drain layers of the second device;
sequentially selectively etching the second source/drain layer, the channel layer and the first source/drain layer of the first device to form a pattern with sidewall extending along a second crystal plane or crystal plane family, and recessing the outer periphery of the channel layer with respect to outer peripheries of the first and second source/drain layers by isotropic etching;
forming a sacrificial gate of the first device in a recess of the channel layer with respect to the first and second source/drain layers of the first device.

29. The method according to claim 28, wherein the defining of the active regions of the semiconductor devices further comprises:
rounding a sharp corner formed by adjacent sidewalls of the channel layer of the second device after the isotropic etching of the channel layer of the second device; and/or
rounding a sharp corner formed by adjacent sidewalls of the channel layer of the first device after the isotropic etching of the channel layer of the first device.

30. The method according to claim 28, wherein after forming the sacrificial gate of the second device and before defining the active region of the first device, the method further comprises: forming a protective layer on surfaces of the first and second source/drain layers of the second device.

31. The method according to claim 28, wherein after forming the sacrificial gate of the second device and before defining the active region of the first device, the method further comprises:
forming a dopant source layer on surfaces of the first source/drain layer and the second source/drain layer of the second device; and
driving dopants from the dopant source layer into the first and second source/drain layers of the second device.

32. The method according to claim 28, wherein after forming the sacrificial gate of the first device, the method further comprises:
forming another dopant source layer on surfaces of the first source/drain layer and the second source/drain layer of the first device; and
driving dopants from the other dopant source layer into the first and second source/drain layers of the first device.

33. The method according to claim 28, wherein after forming the sacrificial gate of the first device, the method further comprises:
forming a silicide on surfaces of the first and second source/drain layers of the second device; and/or
forming a silicide on surfaces of the first and second source/drain layers of the first device.

34. The method according to claim 28, wherein:
the forming of the gate stack of the first device comprises:
forming a first isolation layer around the active regions on the substrate, wherein the first isolation layer has a top surface at a level between a top surface and a bottom surface of the channel layer of the first device;
removing the sacrificial gate of the first device to release a space in the recess of the channel layer with respect to the first and second source/drain layers of the first device;
sequentially forming, on the first isolation layer, a gate dielectric layer and a gate conductor layer of the first device; and
etching back the gate conductor layer, such that a portion of the gate conductor layer outside the recess has a top surface at a level lower than the top surface of the channel layer of the first device;
the method further comprises:
forming, on the first isolation layer, a second isolation layer, wherein the second isolation layer has a top surface at a level between a top surface and a bottom surface of the second source/drain layer of the first device;
forming, on the second isolation layer, an electrical contact layer electrically connected to the second source/drain layer of the first device and the first source/drain layer of the second device, wherein the electrical contact layer has a top surface at a level between a top surface and a bottom surface of the first source/drain layer of the second device; and
the forming of the gate stack of the second device comprises:
forming, on the second isolation layer, a third isolation layer, wherein the third isolation layer has a top surface at a level between a top surface and a bottom surface of the channel layer of the second device;
removing the sacrificial gate of the second device to release a space in the recess of the channel layer with respect to the first and second source/drain layers of the second device;
sequentially forming, on the third isolation layer, a gate dielectric layer and a gate conductor layer of the second device; and
etching back the gate conductor layer, such that a portion of the gate conductor layer outside the recess has a top surface at a level lower than the top surface of the channel layer of the second device.

35. The method according to claim 34, further comprising:
in the forming of the gate stack of the first device, patterning the gate conductor layer of the first device such that a portion of the gate conductor layer extends laterally outward from a corresponding recess;
in the forming of the electrical contact layer, patterning the electrical contact layer such that a portion of the electrical contact layer protrudes laterally with respect to a remaining portion thereof;

in the forming of the gate stack of the second device, patterning the gate conductor layer of the second device such that a portion of the gate conductor layer extends laterally outward from a corresponding recess;

wherein at least some of the portion extending outward of the gate stack of the first device, the portion protruding outward of the electrical contact layer, and the portion extending outward of the gate stack of the second device extend laterally in different directions, and if at least some of those portions overlap vertically, then among the overlapped portions, a lower one extends beyond an upper one.

36. The method according to claim 28, wherein the defining of the active regions of the semiconductor devices further comprises:

thinning the first and second source/drain layers of the second device after forming the sacrificial gate of the second device, such that lateral sizes of the first and second source/drain layers of the second device are reduced; and/or thinning the first and second source/drain layers of the first device after forming the sacrificial gate of the first device, such that lateral sizes of the first and second source/drain layers of the first device are reduced.

37. The method according to claim 36, further comprising:

forming a silicide on surfaces of the thinned first and second source/drain layers of the second device; and/or forming a silicide on surfaces of the thinned first and second source/drain layers of the first device.

38. The method according to claim 36, wherein:

the method further comprises: forming a shielding layer on one, among the sidewalls of the first source/drain layer and the second source/drain layer of the first device and the first source/drain layer and the second source/drain layer of the second device, which is recessed with respect to the sacrificial gate of the second device, the shielding layer having a sidewall substantially coplanar with a sidewall of the sacrificial gate of the second device;

the forming of the gate stack of the first device comprises:

forming a first isolation layer around the active regions on the substrate, wherein the first isolation layer has a top surface at a level between a top surface and a bottom surface of the channel layer of the first device;

removing the sacrificial gate of the first device to release a space in the recess of the channel layer with respect to the first and second source/drain layers of the first device;

sequentially forming, on the first isolation layer, a gate dielectric layer and a gate conductor layer of the first device; and etching back the gate conductor layer, such that a portion of the gate conductor layer outside the recess has a top surface at a level lower than the top surface of the channel layer of the first device;

the method further comprises:

forming, on the first isolation layer, a second isolation layer, wherein the second isolation layer has a top surface at a level between a top surface and a bottom surface of the second source/drain layer of the first device;

at least partially removing the shielding layer to at least partially expose the second source/drain layer of the first device and/or the first source/drain layer of the second device;

forming, on the second isolation layer, an electrical contact layer electrically connected to the second source/drain layer of the first device and the first source/drain layer of the second device, wherein the electrical contact layer has a top surface at a level between a top surface and a bottom surface of the first source/drain layer of the second device; and the forming of the gate stack of the second device comprises:

forming, on the second isolation layer, a third isolation layer, wherein the third isolation layer has a top surface at a level between a top surface and a bottom surface of the channel layer of the second device, and the third isolation layer fills a recess of the second source/drain layer of the second device with respect to the sacrificial gate of the second device to form another shielding layer;

removing the sacrificial gate of the second device to release a space in the recess of the channel layer of the second device with respect to the other shielding layer;

sequentially forming, on the third isolation layer, a gate dielectric layer and a gate conductor layer of the second device; and etching back the gate conductor layer, such that a portion of the gate conductor layer outside the recess has a top surface at a level lower than the top surface of the channel layer of the second device.

39. The method according to claim 28, wherein the defining of the active regions comprises:

forming a hard mask layer;

forming, on the hard mask layer, a first sacrificial layer, the first sacrificial layer having a first sidewall extending in a first direction;

forming, on the first sidewall, a first spacer extending in the first direction, and removing the first sacrificial layer;

transferring a pattern of the first spacer to the hard mask layer, and removing the first spacer;

forming, on the hard mask layer, a second sacrificial layer, the second sacrificial layer having a second sidewall extending in a second direction perpendicular to the first direction;

forming, on the second sidewall, a second spacer extending in the second direction, the second spacer intersecting the pattern of the first sidewall;

transferring a pattern of the second spacer to the hard mask layer, and removing the second spacer; and defining the active regions using the hard mask layer as a mask.

* * * * *